United States Patent
White

(10) Patent No.: US 8,035,087 B2
(45) Date of Patent: Oct. 11, 2011

(54) OPEN-ENDED ELECTROMAGNETIC CORRECTOR ASSEMBLY AND METHOD FOR DEFLECTING, FOCUSING, AND CONTROLLING THE UNIFORMITY OF A TRAVELING ION BEAM

(76) Inventor: Nicholas R. White, Manchester, MA (US)

( * ) Notice: Subject to any disclaimer, the term of this patent is extended or adjusted under 35 U.S.C. 154(b) by 217 days.

(21) Appl. No.: 12/584,384

(22) Filed: Sep. 4, 2009

(65) Prior Publication Data

US 2010/0001204 A1   Jan. 7, 2010

(51) Int. Cl.
  *H01J 1/50* (2006.01)
  *H01J 37/08* (2006.01)
  *G21K 5/10* (2006.01)
(52) U.S. Cl. ......... 250/396 ML; 250/396 R; 250/492.21
(58) Field of Classification Search ........... 250/396 ML, 250/396 R, 492.1, 492.21, 492.3
  See application file for complete search history.

(56) References Cited

U.S. PATENT DOCUMENTS

| | | | | |
|---|---|---|---|---|
| 4,019,989 A * | 4/1977 | Hazewindus et al. | .. | 250/396 ML |
| 4,191,887 A * | 3/1980 | Brown | ................... | 250/396 ML |
| 4,397,611 A * | 8/1983 | Wiesner et al. | ................... | 417/49 |
| 4,468,563 A * | 8/1984 | Tsuno et al. | ........... | 250/396 ML |
| 4,546,258 A * | 10/1985 | Chisholm | .................. | 250/396 R |
| 4,767,930 A * | 8/1988 | Stieber et al. | .......... | 250/396 ML |
| 7,078,713 B2 * | 7/2006 | White | ....................... | 250/492.21 |
| 7,807,983 B2 * | 10/2010 | Purser et al. | ............. | 250/492.21 |
| 7,888,660 B2 * | 2/2011 | Purser et al. | ............. | 250/492.21 |
| 2005/0082498 A1 * | 4/2005 | White | ....................... | 250/492.21 |
| 2005/0263714 A1 * | 12/2005 | Vassiliou et al. | ........ | 250/396 ML |
| 2006/0169924 A1 * | 8/2006 | Purser et al. | ............. | 250/492.21 |

* cited by examiner

*Primary Examiner* — Robert Kim
*Assistant Examiner* — Brooke Purinton
(74) *Attorney, Agent, or Firm* — David Prashker Esq.

(57) ABSTRACT

The present invention is an electromagnetic controller assembly for use in ion implantation apparatus, and provides a structural construct and methodology which can be employed for three recognizably separate and distinct functions: (i) To adjust the trajectory of charged particles carried within any type of traveling ion beam which is targeted at a plane of implantation or a work surface for the placement of charged ions into a prepared workpiece (such as a silicon wafer or flat glass panel); (ii) concurrently, to alter and change the degree of parallelism of the ions in the traveling beam; and (iii) concurrently, to control the uniformity of the current density along the transverse direction of traveling ion beams, regardless of whether the beams are high-aspect, continuous ribbon ion beams or alternatively are scanned ribbon ion beams.

12 Claims, 15 Drawing Sheets

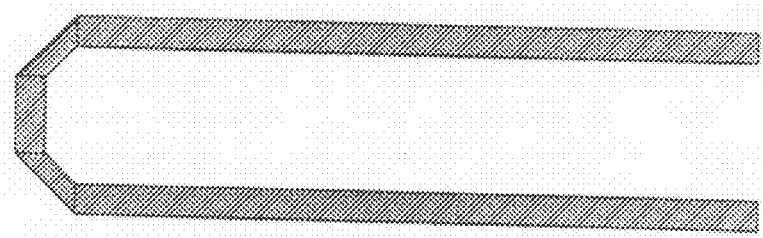
Fig. 11A
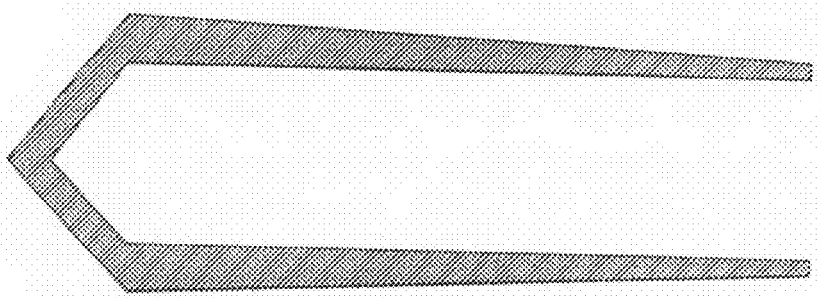
Fig. 11B
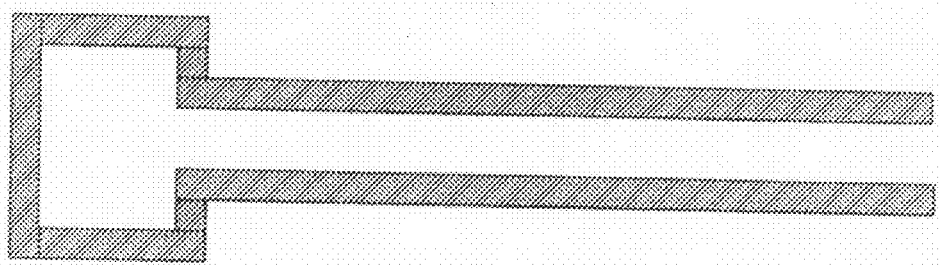
Fig. 11C
Figs. 11A-11C

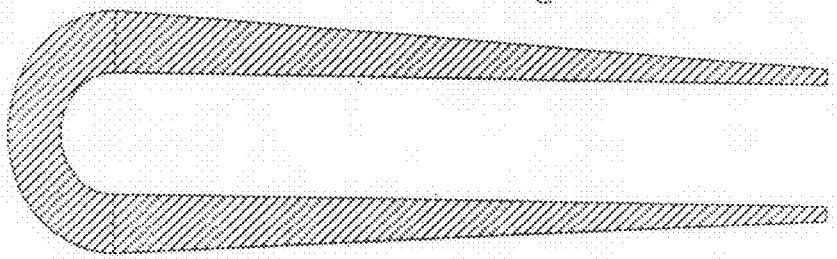
Fig. 11D
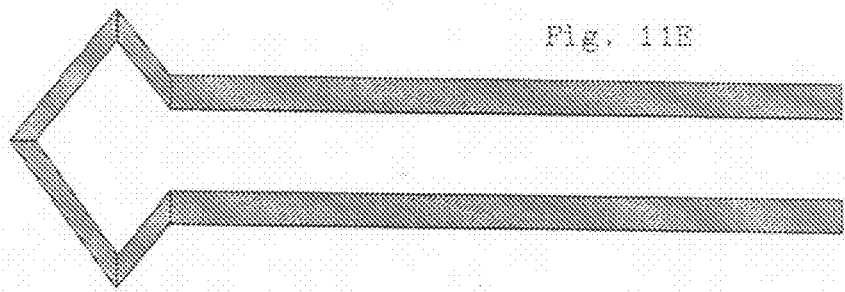
Fig. 11E
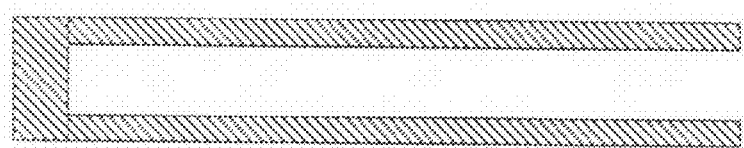
Fig. 11F
Figs. 11D – 11F

Flow Scheme

Current in all coils is programmed in a manner whereby the nth coil each side receives a current of $I_0 + \Delta I_n$, where all $I_0$ are the same, and the $\Delta I_n$ are different fine adjustments.

Set $I_0$ to pre-set the beam collimation, using $J_s = \dfrac{g\sqrt{2MU}}{\mu_0 q L_m L_s}$ If an analyzing magnet is used, $I_0$ will be proportional to the current required by this magnet.

Profile the beam and locate the two edges. This reveals centering errors and collimation errors. Additional instrumentation may be used.

Correct collimation by fine-adjusting $I_0$.

Correct centering by adjusting current closest to the magnetic short, $\Delta I_1$ Measure uniformity profile.

Calculate adjustments to the $\Delta I_n$ values using Equation VII and equation IX.

Fig. 15

OPEN-ENDED ELECTROMAGNETIC CORRECTOR ASSEMBLY AND METHOD FOR DEFLECTING, FOCUSING, AND CONTROLLING THE UNIFORMITY OF A TRAVELING ION BEAM

PRIORITY CLAIM

The present invention was first filed with the U.S. Patent & Trademark Office on Mar. 15, 2007 as U.S. Provisional Patent Application Ser. No. 60/918,099. The priority date of this first filing is expressly claimed herein.

FIELD OF THE INVENTION

This invention is concerned generally with controlling the uniformity and direction of charged particles within an ion beam. More particularly, the invention is directed to the production of more uniform ribbon-shaped ion beams; provides a method for adjusting at least the current density of charged particles in such ion beams; and presents a structural assembly for controlling at least the current uniformity along one transverse direction of ribbon-shaped, traveling beams which are pointed at a target plane for treating prepared workpieces with charged ions—e.g., an ion implanter apparatus for doping silicon wafers or flat-panel display substrates, where the ion beam uniformity must be controlled with great precision.

BACKGROUND OF THE INVENTION

Ion implantation is a ballistic process used to introduce charged particle species (such as atoms or molecules, generally referred to as dopants) into a pre-chosen targeted workpiece substrate in order to make purposefully prepared articles having certain useful properties. In particular today, ion implantation is a manufacturing process used in the making of modern integrated circuits.

In most types of implantation systems, provision is made to move the workpiece to be implanted through the ion beam at a controlled velocity effective to achieve the correct dose of ions. In certain applications (particularly those using 300 mm wafers or larger sized substrates such as flat panel displays as the targeted workpiece for ion implantation), it is advantageous to generate ion beams in the form of ribbon-shaped beams having high aspect ratios, wherein the cross-sectional shape of the beam is much larger in one dimension than the other.

These high aspect ratio beams may be made either by scanning a smaller beam in one dimension at high frequency, or by forming a continuous ribbon-shaped beam. Once formed, such beams are commonly used in ion implanter apparatus and implantation systems where an individual workpiece (such as a silicon wafer or a flat panel display) is moved in a single dimension through the traveling ion beam. Typically, the larger dimension of the ion beam's cross section is greater than one dimension of the targeted workpiece undergoing ion implantation. Consequently, if the current density profile of the ion beam is sufficiently uniform, then as a result of one or more passes of the workpiece through the high aspect ratio ion beam, a uniform dose of ions can be implanted into the workpiece.

In such ion implantation applications, not only is it desirable that the ion beam profile be uniform, but it is also beneficial that the traveling beam have its ions moving in trajectories which are parallel to each other, and are under precise trajectory control—so as to present a uniform current density profile that is appropriate for the implantation of a uniform dose of ions at a constant and controlled incident angle into the targeted workpiece, (a semiconductor wafer or a flat glass panel). It is also very advantageous that the traveling ion beam be substantially free of undesirable charged species that may be concomitantly present within the ion source feed material and/or in the materials forming the ion source itself.

Conventional Techniques for Controlling Current Density Uniformity

In the field of processing materials with ion beams, various techniques have been developed for producing large, approximately-parallel ribbon ion beams with controlled current uniformity. In this context, the term "controlled" is understood to mean that the current density existing over the long dimension of the ion beam (i.e., transverse to its travel axis or direction) adheres to a prechosen or desired profile—which may be uniform and unchanging in its outline, or may be variable and non-uniform in accordance with a pre-chosen pattern (such as a left-right linear ramp).

Furthermore, for many years, the standard practice in this industry has been to use magnetic analysis to separate and reject any unwanted charged species or components from the generated ion beams. However, for large-sized ribbon-shaped beams generally, magnetic analysis as a technique and ion beam purification procedures as a whole have become evermore difficult and costly to perform. This particular problem, as well as the general state of the art of analyzing and transporting ribbon ion beams, is reviewed in depth by White et al., "The Control of Uniformity in Parallel Ribbon Ion Beams Up to 24 Inches in Size", *Applications of Accelerators in Science and Industry* 1998, AIP, p. 830, 1999, the entire text of which is expressly incorporated by reference herein.

Also, it will be noted and appreciated that various examples of ion implanters exist which employ a continuous ribbon beam, but which purposefully omit having any structural or functional means for controlling the current uniformity of the traveling ion beam. Some of these conventionally known implantation machines also have no means for magnetically analyzing (i.e., purifying) the ion beam and thus are unable to remove any contaminant charged species from the traveling beam. For a representative example of such a machine, see Armini et al., "Non-Mass-Analyzed Solar Cell Ion Implanter", in *Nucl. Instr. and Meth, B6* (1985), p. 94, Elsevier, North Holland.

Current Density Uniformity Regulation

Nevertheless, it is far more likely that, within the ion implanters commercially available today, there are specific devices within the apparatus and/or regulatory techniques offered by the apparatus for controlling the current density uniformity of the traveling ion beams. Among these conventionally known devices and techniques are the following representative examples:

(i) One conventionally known format for a multipole lens able to adjust the features of an ion beam is described by Banford, in *The Transport of Charged Particle Beams*, Spon, 1960, and is shown by Prior Art FIG. 2. As seen therein, the multipole lens is conceived with, is created through, and is structurally dependent upon rotational symmetry. The magnetic field generated therein can be expressed in terms of cylindrical harmonics, and is best described using a polar coordinate system. Such lenses are used in various applications of generally cylindrical ion beams, such as electron microscopes and accelerators, where they can control aberrations of the system optics. However, they are not useful for ribbon beams.

(ii) Attention should also be given to the "Panofsky" quadrupole lens design which is also described by Banford, in *The Transport of Charged Particle Beams*, Spon, 1960, and which is illustrated by Prior Art FIG. 3 herein. As is shown, this quadrupole structural format uses a closed rectangular yoke of iron to make a quadrupole lens for a beam of high aspect ratio. The windings on the two long member pieces of the yoke, which extend in one direction, must carry the same ampere turns (but in the opposite sense) to the two windings on the short member pieces that close the yoke and are oriented in the other direction. Both pairs of windings must be uniform in cross section in order to generate a uniform field gradient within the central region. The windings on oppositely positioned sides of the yoke are electrically excited to yield a zone of linearly varying magnetic field (i.e., $dB_y/dx = dB_x/dy$) which is approximately constant within the space bounded by the coils.

(iii) Another commercial type of ion implantation system available today for implanting ions into silicon wafers is illustrated by the Model SHC-80, and the Model VIISta-80, and the Model VIISta HC ion implantation systems—all of which are manufactured by Varian Semiconductor Equipment Associates of Gloucester, Mass. This particular type of ion implantation system is described by U.S. Pat. Nos. 5,350,926 and 5,834,786 (whose texts and drawings are individually incorporated by reference herein); and comprises a discrete set of pole pieces positioned within a deflection magnet which produces variations in a local dipole field component lying normal (perpendicular) to the long dimension of the ribbon beam and to its direction of travel.

As illustrated by Prior Art FIG. 1A [reproduced from U.S. Pat. Nos. 5,350,926 and 5,834,786], the Varian implantation assembly and system comprises an ion source (2) for generating an ion beam (1), an analyzing electromagnet (3), a resolving aperture (4), and a second electromagnet (5). A control unit (36) receives beam intensity information (on line 36*a*) from a beam profiler and sends control signals (along lines 36*b*) to control multipole elements in or near the magnets (3 and 5). The magnet (3) analyzes the mass of the ion beam; and the magnet (5) expands the ion beam along the dispersive plane using magnetic fields in closed loop control to maintain the uniformity of the traveling beam. The result is a ribbon-shaped ion beam (6) that is incident on the target (7). Other details of the Varian implantation system are set forth within the '926 and '786 patents.

(iv) Another previously known construction is the "Cartesian" multipole lens of White et al. [disclosed in the IIT '98 conference published by IEEE] which conforms to the shape of a ribbon beam and is illustrated herein by Prior Art FIGS. 4 and 5 respectively. The construct (as shown in cross-sectional view by Prior Art FIG. 4 and in an overhead sectional view by Prior Art FIG. 5) is a rectangular multipole lens which conforms to the shape of a ribbon beam in order to control its uniformity; and is referred to as a Cartesian multipole as it is best described in Cartesian coordinates, rather than by polar coordinates.

Accordingly, this multipole lens produces a field component "$B_y$" whose variation along the x-axis can be controlled directly, by varying the current of the coils at different x-coordinates, with a resolution determined by the pitch of the coils and poles. Prior Art FIG. 6 shows the effect of exciting a single pair of coils within this "Cartesian" multipole on an otherwise uniform ion beam.

(v) Mitsui Engineering and Shipbuilding manufactures ion implantation apparatus and systems for commercial sale which are described by U.S. Pat. No. 5,834,786 [the text and drawings of which are expressly incorporated by reference herein]. Certain Mitsui systems implant ions into flat panel display substrates using uniform ribbon beams which have been mass analyzed (i.e., are beams which have been purified via the removal of undesirable charged species) by employing a magnet having only modest resolving power (i.e., approximately 2 power)—and which is often sufficient to remove the egregious specie contaminants from ion beams of several different, commercially useful ion source elements.

Prior Art FIG. 1B shows the layout, which corresponds with and is in accordance with the disclosure of the '786 patent. As seen therein, a single magnet is used to render the very broad ribbon ion beam parallel; and a Cartesian multipole lens is used to control the current uniformity of the ion beam. The resulting magnetic field is applied in the central rectangular aperture, through which the ribbon-shaped ion beam passes; and consists of spatially varying dipole components, which cause a local slight deflection of the trajectories for the ions passing through it.

(vi) A technique which utilizes a set of algorithms for adjusting multipole devices, and thereby achieves a greater degree of current density uniformity, has been developed by Diamond Semiconductor Group Inc.; and is typically used as a component in the manufacture of the Varian and Mitsui commercial implanter products identified above. However, such sets of algorithms are very complicated in their specifics because the multipole lenses used in these machines have an awkward transfer function, as illustrated by the details of Prior Art FIG. 6; and consequently are quite difficult to implement in practice as a functional part of any ion implantation system.

(vii) N. R. White has shown that it is possible and often preferable to analyze a ribbon ion beam of high aspect ratio, by bending the ribbon beam in its narrow direction using a uniquely designed analyzer magnet (see U.S. Pat. No. 7,112,789, whose text and drawing is expressly incorporated by reference herein). A key part of this White analyzer magnet innovation is the role of high-current density conductors which provide the boundary for a major part of a region of magnetic field required to deflect and analyze the beam; and is in marked difference and contrast to older analyzer magnet designs in which the shape and position of the ferromagnetic poles define the magnetic field shape and boundaries.

(viii) A method and system for improving the precision of the angle of incidence for ions that impact a semiconductor wafer and of ribbon beams for uniform doping of wafers is disclosed by U.S. Pat. No. 6,933,507 (whose text and drawing is expressly incorporated by reference herein). As described therein, a high permeability rectangular steel structure having the requisite four-sided arrangement of coils and multipole components illustrated by Prior Art FIG. 7 is capable of generating a quadrupole field. However, in addition to being a four-sided closed multipole structure, this rectangularly-shaped device has the particular limitation that the sum of all the currents in all the coils must sum to zero.

(ix) More recently, an electromagnetic regulator assembly for adjusting and controlling the current uniformity of continuous ion beams is disclosed by U.S. Pat. No. 7,078,713 (the text and drawings of which are expressly incorporated herein by reference). This multipole uniformity regulator assembly preferably comprises two high-permeability parallel steel bars which are not joined together magnetically, and constitute the ferromagnetic poles upon which one or more arrays of coils are wound. This device is capable of directly controlling the gradient of the transverse magnetic field between the two bars as a function of position, by means of the individual coil currents; and is well suited for controlling the uniformity of an ion beam directly, as described fully by the '713 patent.

\*\*\*\*\*\*\*\*\*\*\*\*\*\*\*\*\*\*

In addition to all of the foregoing, it will be recognized and appreciated by those ordinarily skilled in this field that there are two distinct characteristics and points of information that pertain to and are shared in common by the prior art constructs and manufactures. Without exception the above-identified prior art devices are constructed in such a way that (1) the average magnetic field that can be applied within the usable zone available for beam adjustment is close to zero in value, and (2) that generally there is a particular location within the ion beam that is traveling through such a prior art device where the applied magnetic field value falls to zero.

Collimation Aspects

It will be noted and appreciated that, by definition and as used herein, the phrase "controlling the uniformity" means that the current density of charged particles along the long width dimension (the x-axis) of the beam is caused to possess and exist in a desired profile, as described above.

In contrast, the phrase "controlling the parallelism" or "collimation" means that the individual trajectories of the charged particles constituting the ion beam as a whole have a common directional angle and maintain a substantially similar spatial distance between them as they travel.

Accordingly, the parameter of "uniformity" for an ion beam should not be confused with, or be misunderstood or misconstrued as being either the functional or definitional equivalent of, or as being similar to, the parameter of "parallelism" for a traveling ion beam.

Dual-Function Assemblies and Systems

It is also of considerable interest that some more recently developed ion beam implantation systems have utilized a single deflecting/analyzing magnet together with a discrete multipole lens—a purposeful combination of two different structures which together undertake and perform the dual functions of collimating (increasing the parallelism) as well as controlling the uniformity (current density) of the traveling ion beam. For example, the ion implantation systems disclosed by U.S. Pat. Nos. 5,350,926 and 5,834,786 teach the use of magnets and multipoles (integrated or distinct) for analyzing, shaping and rendering more parallel the ion trajectories of a beam; and concurrently, but separately, describe the use of particular multipole elements (integrated or distinct) to control the charged particle uniformity (current density) of the ions in the beam. For example, in Prior Art FIG. 1A, it will be seen that three multipole lenses at different locations are provided, thereby allowing concurrent adjustment of these two separate functions.

As a variant of such double-structure combinations, it is possible to use two multipole lenses (in combination with a single deflecting/analyzing magnet) wherein each multipole lens acts separately and independently to provide only one of the aforementioned dual functions for the system. An advantage of such double-structure systems is that the traveling ion beam is handled in a symmetric fashion along its major dimension, which minimizes more subtle variations in process parameters such as the instantaneous peak current density and the integrated ion dose.

Scanned Ion Beam Systems

Somewhat analogous assemblies and systems have also been proposed and built, using scanned ion beams. As is well recognized in this technical field, the scanning technique provides a convenient means for controlling the uniformity of the implanted ions in a workpiece. However, some scanned ion beam assemblies and systems also provide for collimation and fine control of a scanned beam, if desired.

For example, a range of methods have been developed for scanning ion beams and then passing the scanned beam through correcting devices to render the beams more parallel. See for example, U.S. Pat. Nos. 4,276,477; 4,745,281; 4,922,106; and 5,091,655 which describe techniques for parallel-scanning ion beams, and U.S. Pat. No. 4,980,562 which describes means for controlling the uniformity of the ion implant by modifying the shape of the waveform used to scan the beam. See also U.S. Pat. No. 7,105,839 in which a multipole corrector makes fine adjustments to the beam parallelism in response to real-time measurement. [Each of U.S. Pat. Nos. 4,276,477; 4,745,281; 4,922,106; 4,980,562; 5,091,655 and 7,105,839 individually is expressly incorporated by reference herein].

It will be noted also that when using such scanned ion beam systems, it is very desirable first to collimate (i.e., focus into parallel pathways) the diverging and/or scanned ion beams; and then afterwards to fine-tune the current uniformity of these collimated beams. Several techniques have been generated for achieving this purpose; and, in some of these, a diverging ion beam is passed through a collimating device—such as a quadrupole lens.

Attention is directed to the established fact that the magnetic field in a quadrupole lens typically falls to zero value at the center of the device—although it is well known that a dipole field may be superimposed on the quadrupole field; and that many commercial instances of collimated implanter systems presently exist which use a quadrupole lens for this purpose. In most, if not all, of these quadrupole lens systems, the shape of the ferromagnetic pole is used as the primary control of the magnetic field gradient—since, to a good approximation, the field is inversely proportional to the pole gap. This point of control and regulation can be achieved in a variety of different structural ways:

For example, in the system disclosed by U.S. Pat. No. 5,126,575, wedge-shaped poles which have been pre-arranged and fixed in parallel are used. Thus in this system, owing to the wedge-shaped configuration of the individual fixed poles, the length of the ion beam travel pathway is greater (i.e., longer in distance) at one side of the pole than at the other; and the deflection of the ions is thereby increased at this longer pole side in comparison to the shorter pole side. This result provides a combination of deflection and focusing capabilities which is effective for controlling collimation.

However, in these systems where the magnetic field of the quadrupole lens falls to zero value (or near zero value) within the device, there also exists the very real likelihood of having unwanted physical effects and undesirable consequences which concomitantly disrupt the current density and uniformity of the traveling ion beam. The nature of such concomitant effects and consequences is evidenced and demonstrated by the following:

(i) N. R. White has shown [via U.S. Pat. No. 5,350,926] that when a continuous high current beam passes through a magnetic field, and the field is below a certain threshold value, plasma instability within the beam may cause it to fluctuate in size.

(ii) Glavish [via U.S. Pat. No. 5,438,203] has demonstrated that as a beam is magnetically scanned by an alternating magnetic field, when the field passes through zero, the size of the beam may fluctuate; which in turn, leads to a loss of control of uniformity in the scanned beam. This effect is seen in scanned beams using beam currents of tens of microamps and higher; and has been recognized as being a major obstacle to the commercialization of magnetically scanned high current beams. Glavish has also shown that this particular problem may be avoided by scanning the beam with a "unipolar" scanner—that is, one in which the magnetic field does not pass through zero.

(iii) It has also been found that the aforementioned effects are not controlled by the use of a plasma generator. To the contrary, in certain instances, a significant growth in a disturbance in the ion beam uniformity, centered on the null in the magnetic field, was observed as the plasma supply was increased.

Ion Beam Characteristics

It is generally recognized and appreciated that, in the absence of an equal density of electrons within an ion beam, the positive ions in the beam repel each other; and consequently the beam may blow up through mutual repulsion of the ions constituting the beam itself. Space-charge neutralization can increase the beam current that can be transported through a vacuum system by many orders of magnitude; and for this reason, is commonly employed and exploited for effect in all high-current ion implanters.

A space-charge neutral beam contains a density of electrons equal to the density of positive ions. Inevitably it contains both the beam ions and other ions generated from residual gas. This mixture of different ion species meets most of the generally accepted definitions for a plasma; and, under most conditions, the beam typically behaves as a plasma. For instance, the electrons ideally develop a well-defined temperature, and thus have a Maxwellian velocity distribution. In addition, there should be an almost complete absence of electric fields within a plasma; hence the beam tendency to blow up is suppressed.

Ion implanter apparatus and systems frequently employ plasma generators to enhance beam space-charge neutralization and to ensure the existence of a population of low-energy electrons within the beam. Accordingly, space-charge neutralization is required to successfully control the shape, transport and uniformity of high-current beams.

Plasmas and Plasma Instability

It has long been recognized that ion beams typically act as plasmas, and thus plasma instability for the beam can be a problem. In the past, the loss of space-charge neutralization often was attributed only to the existence of an applied potential which attracted and removed negative charges from the beam. In reality, the situation is far more complex.

Plasmas can transmit a number of types of waves. In general, these waves contain electric fields, even if they are of the type known as "ion sound" waves; and waves modify and upset the balance of ions and electrons in the beam. Moreover, in conditions known as "plasma instability", various waves can grow in the plasma, and these comprise amplified noise or recognizable standing waves.

Many plasma instabilities have frequencies of a few hundred kilohertz. They are strongly affected by magnetic fields; and thus a spatially or temporally varying magnetic field applied to the beam can effectively act as a counterbalance and overcome a certain amount of plasma instability.

When a plasma is unstable, and electric fields at these frequencies are present—the beam ions can be deflected by these fields, and the transmission of the beam can fall, because the time-averaged emittance of the beam is increased by the time-varying deflections. Also variations in the magnetic field strength over time can cause unpredictable and unexpected sudden fluctuations in beam current or current density. Therefore, for all these reasons, plasma instability remains a problem which still is very hard to control.

Technical Significance

It is generally believed that as a result of the plasma conditions described in the above-identified implanter systems, non-uniformities in the current density of the ribbon beams have been produced and observed; and these non-uniformities of current density have been unambiguously associated with a collimating or scanning magnet which is present and functioning in a spatial zone where the magnetic field value falls near or to zero. The phenomenon of variations in beam current density being associated with very low values of magnetic field is not restricted to either continuous ion beams or to scanned ion beams alone. To the contrary, the magnitude of the phenomenon varies with and depends upon the plasma conditions existing within the ion beam, regardless of whether the beam is scanned or continuous.

****************************

For these reasons, there remains today a well recognized and long standing need for the development of an assembly which would provide the user with the capability of adjusting a single operational controller in order to raise or lower the current density at will within a single defined volumetric zone (relative to that in the remainder of the ion beam), and with minimal complicating side effects. Desirably also, such an improved assembly for adjusting current density uniformity of a traveling ion beam would be simple and intuitive to operate; would be of simplified design and construction; and would markedly reduce the power consumption and heat load of ion implanters which generate charged particle beams. Also, such an improvement would avoid having a spatially varying magnetic field which passes through a near-zero value at a location within the ion beam, and accordingly would deflect the ion beam as a whole. Finally, while the functionality of the improved assembly is complex, the size, weight, and cost of such a device would desirably be relatively small.

SUMMARY OF THE INVENTION

The present invention has multiple aspects and may be defined in the alternative. A first aspect provides, in an ion implanter apparatus including a source for the generation of charged particles as a traveling ion beam, means for directing the traveling ion beam in a desired direction, and a plane surface for the implantation of charged particles in the traveling ion beam into a prepared workpiece, the improvement of an electromagnetic corrector assembly for deflecting charged particles in a traveling ion beam into a desired trajectory, or for collimating charged particles in a traveling ion beam, or for adjusting and controlling the current uniformity of charged particles in a traveling ion beam, said electromagnetic corrector assembly comprising:

an open-ended framework having a measurable interior spatial volume and comprised of at least
  (i) a first rod-like arm of fixed axial length and girth having two discrete ends and formed of a ferromagnetic material,
  (ii) a second rod-like arm of prechosen axial length and girth having two discrete ends and formed of a ferromagnetic material, said second rod-like arm being at a preset gap distance from said first rod-like arm, and
  (iii) a third rod-like arm of predetermined axial length and girth having two discrete ends and formed of a ferromagnetic material, said third rod-like arm being tangibly attached to and joined with said first and second rod-like arms to create a unified ferromagnetic framework with demonstrably high magnetic permeability;

at least a first multipole coil array disposed upon said first rod-like arm, said multipole coil array having a discernible length and being comprised of at least three wire coils wound independently upon and positioned adjacently at preselected sites over the axial length of said first rod-like arm, each of said wire coils of said multipole coil array being formed of electrically conductive matter and being wound to lie orthogonally to the axial length of said first rod-like arm;

a circumscribed spatial passageway present within the interior spatial volume of said open-ended framework wherein said spatial passageway is dimensionally circumscribed in an x-axis direction by the length of said multipole coil array and in a y-axis direction by the distance separating said multipole coil array from the plane surface of said second rod-like arm, said circumscribed spatial passageway being suitable for the application of a contiguous magnetic field upon an ion beam traveling therethrough; and on-demand means for passing electrical current independently and concurrently through each of said adjacently positioned wire coils of said multipole coil array, whereby (1) each energized wire coil independently and concurrently generates an orthogonally extending and individually adjustable zone of magnetic field gradient across said circumscribed spatial passageway, (2) each zone of magnetic field gradient forming said contiguous magnetic field is individually and concurrently altered on-demand to generate a customized magnetic field gradient across said circumscribed spatial passageway, (3) said plurality of customized magnetic field gradient zones collectively form a contiguous magnetic field over said circumscribed spatial passageway, (4) the application of said customized magnetic field gradients of said contiguous magnetic field upon an ion beam traveling through said circumscribed spatial passageway can be used to increase the uniformity of charged particles in a traveling ion beam, or to improve the parallelism of charged particles in a traveling ion beam, or to alter the overall direction of charged particles in a traveling ion beam, and (5) said third rod-like arm of said open-ended framework serves as a short-circuit member and creates a magnetic short-circuit between said first rod-like arm and said second rod-like arm, providing thereby a fixed boundary adjacent to which the magnetic field is known to be near zero.

A second aspect and definition provides—in an ion implanter apparatus including a source for the generation of charged particles as a traveling ion beam, means for directing the traveling ion beam in a desired direction, and a plane surface for the implantation of charged particles in the traveling ion beam into a prepared workpiece, the improvement of an electromagnetic corrector assembly for deflecting charged particles in a traveling ion beam, for collimating charged particles in a traveling ion beam, and for adjusting and controlling the current uniformity of charged particles in a traveling ion beam, said electromagnetic corrector assembly comprising:

a substantially U-shaped frame having a measurable interior spatial volume and comprised of at least (i) a first elongated rod of fixed axial length and girth which has two discrete rod ends and is formed of a ferromagnetic material, (ii) a second elongated rod of fixed axial length and girth which has two discrete rod ends and is formed of a ferromagnetic material, said second elongated rod being at a preset gap distance from and in a substantially parallel position to said first elongated rod, and (iii) a third discrete rod of fixed axial length and girth, whose length is shorter than that of said first and second rods, which has two discrete rod ends and is formed of a ferromagnetic material, said third rod being positioned substantially perpendicularly to and being tangibly attached to and joined with said first and second rods to create a unified ferromagnetic framework with demonstrably high magnetic permeability;

a first multipole coil array disposed upon said first elongated rod, said first multipole coil array having a discernible length and being comprised of at least three wire coils wound independently upon and positioned adjacently at preselected sites over the axial length of said first elongated rod, each of said wire coils of said first multipole coil array being formed of electrically conductive matter and being wound to lie orthogonally to the axial length of said first rod;

a second multipole coil array disposed upon said second elongated rod, said second multipole coil array having a discernible length and being comprised of at least three wire coils wound independently upon and positioned adjacently at preselected sites over the axial length of said second elongated rod, each of said wire coils of said second array being formed of electrically conductive matter, and being wound to lie orthogonally to the axial length of said second rod;

a circumscribed spatial passageway present within the interior spatial volume of said U-shaped frame wherein said spatial passageway is dimensionally circumscribed in an x-axis direction by the length of said first and second multipole coil arrays and in a y-axis direction by the distance separating the plane surface of said first multipole coil array from the plane surface of said second multipole coil array, said circumscribed spatial passageway being suitable for the application of a contiguous magnetic field upon an ion beam traveling therethrough; and on-demand means for passing electrical current independently and concurrently through each of said adjacently positioned wire coils of said first and second multipole coil arrays, whereby (1) each energized wire coil independently and concurrently generates an orthogonally extending and individually adjustable zone of magnetic field gradient across said circumscribed spatial passageway, (2) each zone of magnetic field gradient forming said contiguous magnetic field can be individually and concurrently altered on-demand to generate a customized magnetic field gradient over said circumscribed spatial passageway, (3) said plurality of customized magnetic field gradient zones collectively form a contiguous magnetic field over said circumscribed spatial passageway, (4) the application of said customized magnetic field gradients of said contiguous magnetic field upon an ion beam traveling through said circumscribed spatial passageway can used to increase the uniformity of charged particles in a traveling ion beam, or to improve the parallelism of charged particles in a traveling ion beam, or to alter the trajectories of charged particles in a traveling ion beam, and (5) said third rod of said open-ended framework serves as a magnetic short-circuit member and creates an electromagnetic short-circuit between said energized multipole coil arrays disposed upon said first rod and said second rod.

A third aspect and definition presents—an electromagnetic corrector assembly for deflecting charged particles in a traveling ion beam, for collimating charged particles in a traveling ion beam, and for adjusting and controlling the current uniformity of charged particles in a traveling ion beam, said electromagnetic corrector assembly comprising:

a substantially U-shaped frame having a measurable interior spatial volume and comprised of at least
   (i) a first elongated rod of fixed axial length and girth which has two discrete rod ends and is formed of a ferromagnetic material,
   (ii) a second elongated rod of fixed axial length and girth which has two discrete rod ends and is formed of a ferromagnetic material, said second elongated rod being at a preset gap distance from and in a substantially parallel position to said first elongated rod, and
   (iii) a third discrete rod of fixed axial length and girth which has two discrete rod ends and is formed of a ferromagnetic material, said third rod being shorter than said first and second rods and being positioned substantially perpendicularly to and being tangibly attached to and joined with said first and second rods to create a unified ferromagnetic framework with demonstrably high magnetic permeability;

a first multipole coil array disposed upon said first elongated rod, said first multipole coil array having a discernible length and being comprised of at least three wire coils wound independently upon and positioned adjacently at preselected sites over the axial length of said first elongated rod, each of said wire coils of said first multipole coil array being formed of electrically conductive matter and being wound to lie orthogonally to the axial length of said first rod;

a second multipole coil array disposed upon said second elongated rod, said second multipole coil array having a discernible length and being comprised of at least three wire coils wound independently upon and positioned adjacently at preselected sites over the axial length of said second elongated rod, each of said wire coils of said second array being formed of electrically conductive matter, and being wound to lie orthogonally to the axial length of said second rod;

a circumscribed spatial passageway present within the interior spatial volume of said U-shaped frame wherein said spatial passageway is dimensionally circumscribed in an x-axis direction by the length of said first and second multipole coil arrays and in a y-axis direction by the distance separating the plane surface of said first multipole coil array from the plane surface of said second multipole coil array, said circumscribed spatial passageway being suitable for the application of a contiguous magnetic field upon an ion beam traveling therethrough; and on-demand means for passing electrical current independently and concurrently through each of said adjacently positioned wire coils of said first and second multipole coil arrays, whereby
   (1) each energized wire coil independently and concurrently generates an orthogonally extending and individually adjustable zone of magnetic field gradient across said circumscribed spatial passageway,
   (2) each zone of magnetic field gradient forming said contiguous magnetic field can be individually and concurrently altered on-demand to generate a customized magnetic field gradient over said circumscribed spatial passageway,
   (3) said plurality of customized magnetic field gradient zones collectively form a contiguous magnetic field over said circumscribed spatial passageway,
   (4) the application of said customized magnetic field gradients of said contiguous magnetic field upon an ion beam traveling through said circumscribed spatial passageway can used to increase the uniformity of charged particles in a traveling ion beam, or to improve the parallelism of charged particles in a traveling ion beam, or to alter the trajectories of charged particles in a traveling ion beam, and
   (5) said third rod of said open-ended framework serves as a magnetic short-circuit member and creates a magnetic short-circuit between said energized multipole coil arrays disposed upon said first rod and said second rod, minimizing the magnetic field immediately adjacent to said third rod.

BRIEF DESCRIPTION OF THE DRAWINGS

The present invention may be more easily understood and better appreciated when taken in conjunction with the accompanying drawings, in which:

Prior Art

Prior Art

Prior Art

Prior Art

Prior Art

Prior Art

Prior Art

Prior Art

FIGS. 11A-10F are schematic views of some representative and exemplary formats for the overall outline and configuration of the framework in the electromagnetic controller assembly comprising the present invention;

FIG. 15 is a Flow Scheme stating the manipulative steps which comprise the method of the present invention.

DETAILED DESCRIPTION OF THE INVENTION

Figure 1A:
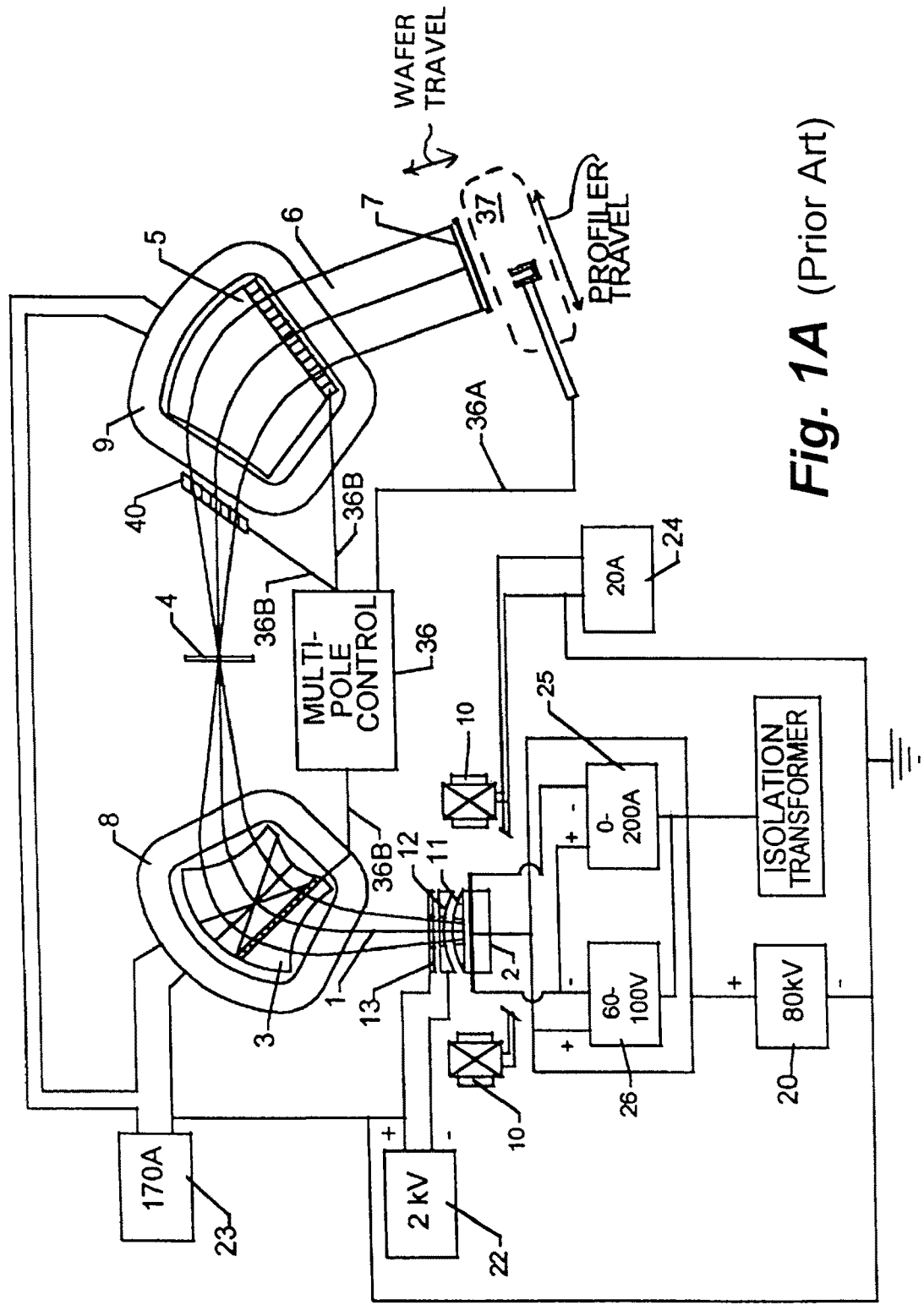
FIG. 1A illustrates an ion implanter system described by U.S. Pat. No. 5,834,786.
Figure 1B:
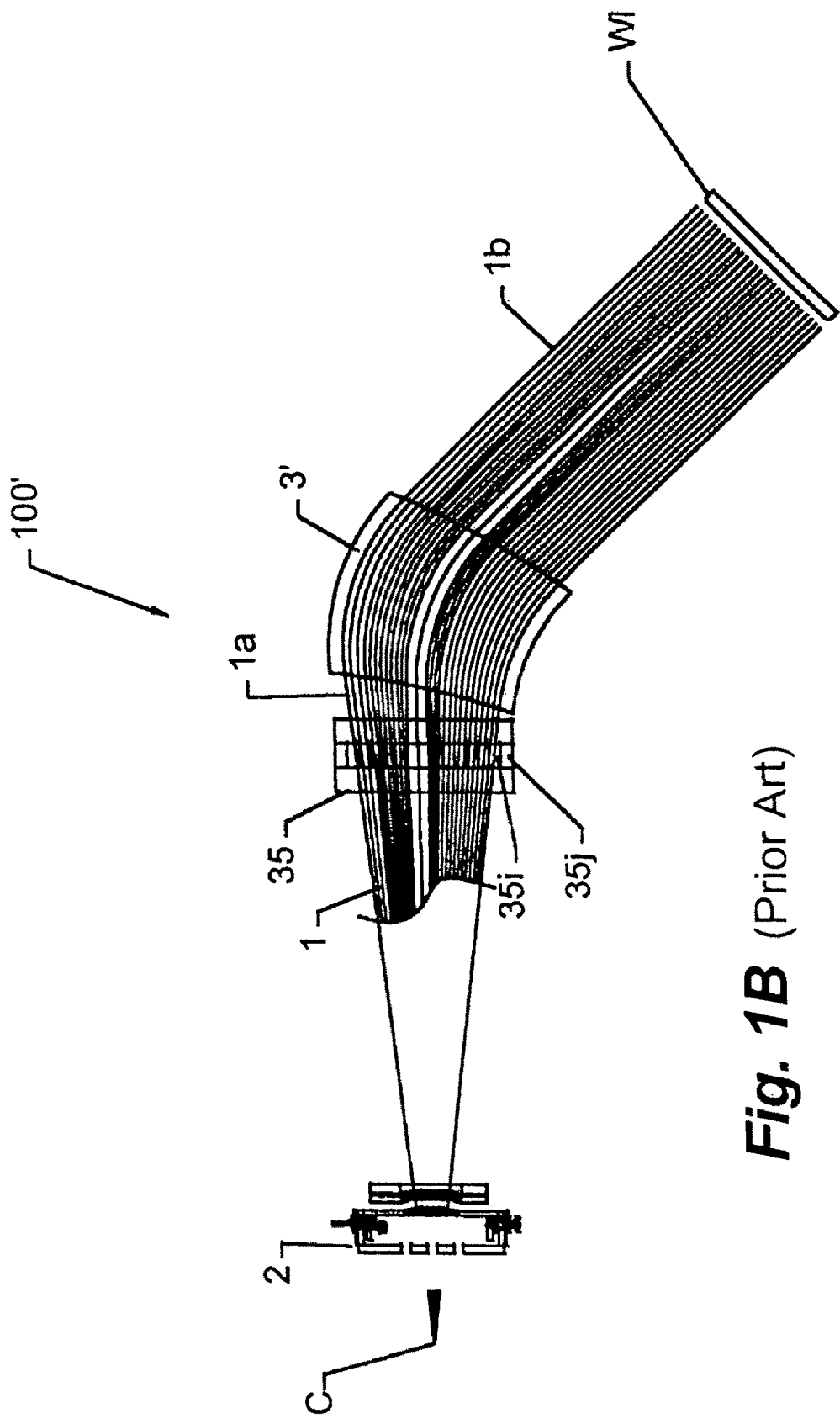
FIG. 1B illustrates another ion implanter system described by U.S. Pat. No. 5,834,786.
Figure 2:
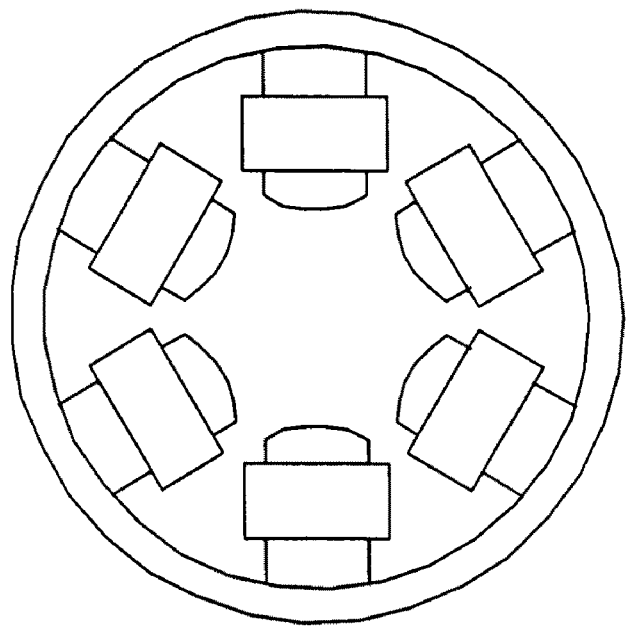
FIG. 2 illustrates the arrangement of a conventional sextupole lens for an ion beam.
Figure 3:
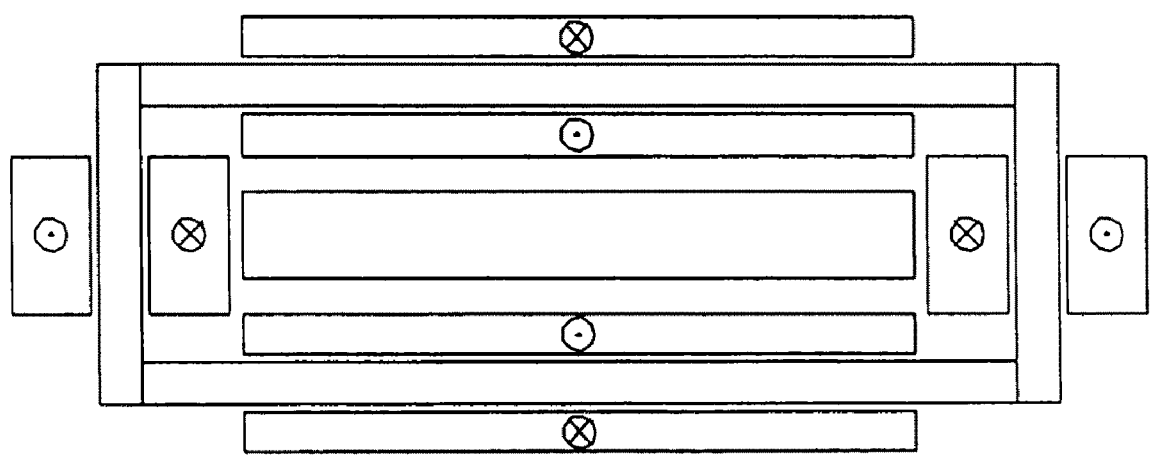
FIG. 3 illustrates the arrangement of a 'Panofsky' quadrupole.

The present invention is an electromagnetic controller assembly and methodology which presents a number of unique characteristics and previously unforeseen capabilities. Among these are the following:

1. The assembly provides an open-ended ferromagnetic frame structure having at least three closed sides and one open side.
2. The assembly employs at least one, and preferably two multipole arrays of wire coils to generate and apply a contiguous magnetic field between the closed sides of the ferromagnetic frame.
3. The ferromagnetic frame of the assembly includes a magnetic short-circuit which is positioned between two of its closed sides.
4. The contiguous magnetic field generated by the assembly has a zero magnetic value at one closed side and a maximum value adjacent the open-ended side of the frame.
5. The assembly can be employed for three recognizably separate and distinct functions, which are:
   (i) to adjust the travel direction of charged particles carried within any type of traveling ion beam which is targeted at a plane of implantation or a work surface for the placement of charged ions into a prepared workpiece (such as a silicon wafer or a flat glass panel);
   (ii) concurrently, to alter and change the degree of parallelism of the ions in the traveling beam; and
   (iii) concurrently, to control the uniformity of the current density along the transverse direction of traveling ion beams.
6. The controller assembly is suitable for use with any type or form of continuous ion beams as well as with any manner of scanned ion beams.

I. Definitions

In order to avoid inconsistencies in terminology, to eliminate ambiguities in denotative and connotative meanings, and to increase the clarity and completeness of comprehension and understanding, a set of definitions is presented below. The terms and jargon defined below will be employed consistently and repeatedly herein to describe and claim the present invention in a manner that not only sets forth what the present invention is and how it is to be made and used, but also separates and distinguishes the inventive subject matter from what it is not.

Ion beam: Any beam of charged particles, including electrons, positive or negative ions, molecules, clusters, or sub-atomic particles.

Ribbon beam: An ion beam having a cross section characterized by a long dimension and a short dimension, the long dimension being at least twice the short dimension, and usually at least five times the short dimension. The long dimension is usually larger than a dimension of the face of the workpiece to be processed with the beam.

Scanned ribbon beam: A beam (typically circular or elliptical) which is scanned in a plane within a ribbon-shaped envelope, and at any one point in the envelope, the beam will be interrupted twice in each scan.

Continuous ribbon beam: A ribbon beam which is not scanned, and in which the current at any point is uninterrupted for at least the time required to process one workpiece.

The x, y, and z coordinates (or axes): The z coordinate (or axis) is the intended direction of travel for the ion beam, and is generally curvilinear. The x-axis is aligned with the larger cross sectional dimension of the intended beam. The y-axis is aligned with the smaller cross sectional dimension of the intended beam. The z-axis is generally presumed to run down the approximate center of the ion beam as it travels along its intended curvilinear pathway. However for certain mathematical treatments, the z-axis is offset to one side of the beam, as described in that section.

Downstream: The travel pathway or the targeted angle and direction of the ion beam.

Upstream: Opposite to the travel pathway or 180 degrees from the targeted angle and direction of the ion beam.

The use of terms such as 'left, right, up, down' may refer to specific embodiments, but is not intended to be limiting, as the invention may be oriented in space in any convenient manner.

Adjusting an ion beam: Altering the current density along the long dimension (the target direction or travel pathway axis) of the beam so as to adhere to a desired profile.

Controlling an ion beam: Maintaining a desired current density along the long dimension (the target direction or travel pathway axis) of the beam so as to adhere to a desired profile.

Uniform ion beam: A concentration of charged particles within an ion beam which is substantially consistent, homogeneous, symmetrical, or regular along the x-direction.

Non-uniform ion beam: A concentration of charged particles within an ion beam which is substantially inconsistent, heterogeneous, asymmetrical, or irregular in cross-sectional profile.

II. The Electromagnetic Controller Assembly

The subject matter as a whole comprising the instant electromagnetic controller assembly and the manner of its use provides: A substantially open-ended ferromagnetic framework having three closed support arm sides and a fourth open-ended side; at least one multipole coil array which is disposed on a transversely positioned support arm for the generation of a contiguous magnetic field of known strength and profile; and a circumscribed spatial passageway which has preset dimensions and encompasses (via x-axis and y-axis coordinates) the entirety of a moving ion beam (which is traveling in the direction of the z-axis).

This electromagnetic controller assembly is used to generate a contiguous magnetic field of predetermined strength; and the generated magnetic field is applied, adjusted and aligned within the confines and dimensions of the circumscribed spatial passageway. However, unlike so many prior art devices, the present invention is structured such that the local magnetic field gradients ("$dB_y/dx$") forming the contiguous magnetic field can be directly adjusted and controlled at-will by the user.

The at-will adjustments and control of the magnetic field gradients are achieved by varying the electric current(s) to individual wire coils of the multipole coil array(s) disposed on the transverse rod arm(s); which in turn, concomitantly alters the strength of the individual magnetic field gradients within carefully selected spatial zones, which comprise the contiguous magnetic field bounded within the circumscribed spatial passageway.

A. One Simple Construction

The Ferromagnetic U-Shaped Framework

Figure 8:
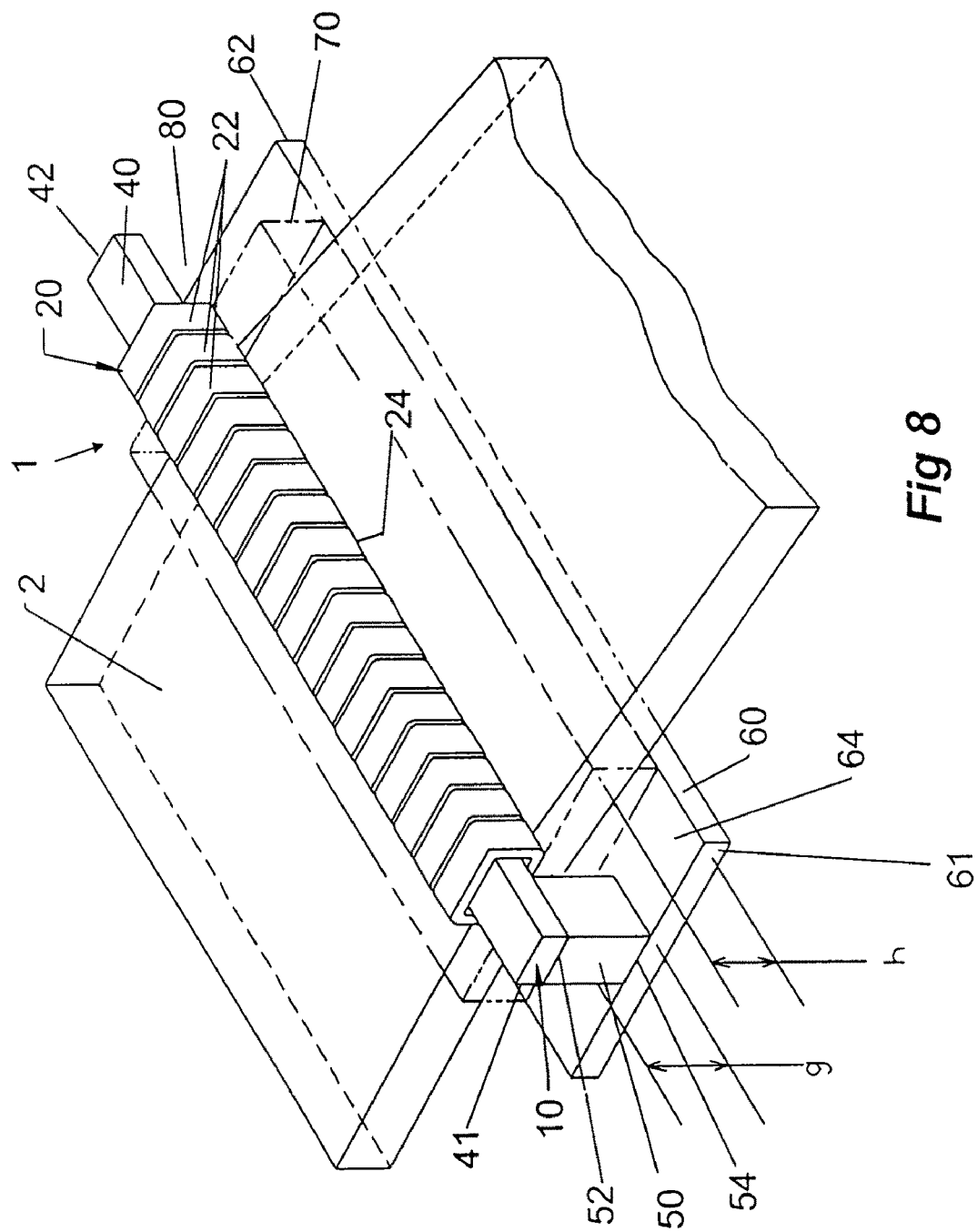
FIG. 8 presents a perspective view of the simplest structural construction for the electromagnetic controller assembly comprising the present invention.

A simple embodiment of the present invention is exemplified and illustrated by the assembly of FIG. 8. As seen therein, the assembly 1 includes a substantially U-shaped ferromagnetic framework 10 formed by the interconnection of a first transverse support arm or bar member 40, a second transverse support arm or bar member 60, and a third support arm or bar member 50 which lies in substantially perpendicular position to the transverse arms 40, 60.

As seen in FIG. 8, the first transverse support arm 40 is an elongated ferromagnetic rod of fixed linear length and girth; has two discrete rod ends 41, 42; and is formed of at least one ferromagnetic material, typically iron or low-carbon steel.

Similarly, the second transverse support arm 60 is an elongated ferromagnetic board of prechosen linear length and girth; has two discrete board ends 61, 62; and is also formed of at least one ferromagnetic material. The second support arm 60, however, rests at a preset distance from and in substantially parallel position to the first support arm 40 in the assembly 10.

The third support arm 50 is a rod having a short predetermined linear length and a fixed girth; has two discrete rod ends 52, 54; and is also composed of at least one ferromagnetic material. The third support arm, however, is positioned substantially perpendicularly to, and is tangibly attached to and magnetically joined with, each of said first and second transverse support arms 40, 60.

The transverse support arms 40, 60 illustrated by FIG. 8 are shown as being straight and symmetrical bar members having a fixed length and girth, and wherein each transverse support arm is axially sized to be somewhat longer in length than the x-axis dimension of the continuous ion beam to be controlled. The oppositely positioned first and second transverse support arms 40, 60 are oriented to lie in parallel and across a preset gap distance "g" from each other; and these two support arms 40, 60 serve as two closed sides which together bound and define part of the spatial volume interior within the U-shaped configuration of the framework 10.

The third perpendicularly positioned ferromagnetic support arm 50 illustrated by FIG. 8 has a markedly shorter length than the first and second transverse support arms 40, 60; and is tangibly attached to and joined at its discrete ends 52, 54 to the end 41 of the first transverse support arms 40—and the end 61 of the second transverse support arm 60, thereby providing a continuous high permeability path for the framework 10.

A Multipole Coil Array

In the simple construct illustrated by FIG. 8, a multipole coil array 20 comprised of individual wire coils 22 in series is disposed upon the first, transversely positioned, ferromagnetic support arm 40 in the U-shaped framework 10. This multipole coil array 20 is comprised of at least three wire coils 22 which are wound independently upon and positioned adjacently at preselected sites over the axial length of the first elongated support arm 40, such that each wire coil 22 is individually located and lies separated from its neighboring coil in the array at a small preset distance. Also, each of the wire coils 22 in this discrete multipole coil array 20 is formed of electrically conductive matter; and each coil is purposefully wound to lie orthogonal to the axial length dimension of the first transverse support arm 40. As a consequence, the single multipole coil array 20 provides a series of individual, separate and adjacently positioned single wire coils which are individually oriented and aligned with the x-axis of the assembly 1.

It will be also be noted and appreciated, as shown by FIG. 8, that the aligned series of multiple individual wire coils 22 constitute a plane surface 24 for the discrete multipole coil array 20 along which each wire coil is orthogonally wound and is orthogonally set at separate fixed positions along and over the axial length of the ferromagnetic first support arm 40. Moreover, the array 20 is congruent with (i.e., coincides exactly when superimposed) and encompasses the breadth dimension of the circumscribed spatial passageway 70 through which the ion beam travels in-situ. The orthogonal winding and orientation of the individual wire coils 22 is thus a unique and singular feature; and is a construction which is markedly different and distinguishable from many of the coiled windings in previously known multipole and lens structures.

The Circumscribed Spatial Passageway

Present between the plane surface 24 of the multipole coil array 20 (then disposed over the axial length of the first transverse support arm 40) and the second transverse support arm 60 is a circumscribed spatial passageway 70 which encompasses the entirety of an ion beam 2 traveling therethrough; and provides a confined and precisely defined volumetric region for adjusting and controlling the magnetic field gradients of a contiguous magnetic field which is applied to the moving ion beam 2.

As shown by FIG. 8, the circumscribed spatial passageway 70 is bounded on one closed side by the plane surface 24 of the multipole coil array 20 disposed on the first transverse support arm 40; is bounded on a second closed side by the surface 64 of the second transverse support arm 60; and is bounded on a third closed side by the perpendicularly placed axial length of the third ferromagnetic support arm 50 in the U-shaped framework 10. In comparison, the fourth side of the circumscribed spatial passageway 70 is completely open and unobstructed.

It will be noted that the circumscribed spatial passageway 70 is always a subset of the preset gap distance "g"; and typically is slightly smaller than the overall spatial dimensions of the interior spatial volume defined by and encompassed within all three ferromagnetic support arms 40, 50, and 60 of the U-shaped framework 10. The circumscribed spatial passageway 70 is also usually smaller in dimensional size and spatial volume than the total region of contiguous magnetic field which is provided by the multipole coil array 20 of wire coils 22 then disposed upon the first transverse support arm 40 in the U-shaped configuration.

Thus, as shown by FIG. 8, the circumscribed spatial passageway 70 is limited in the x-axis direction by the linear length of the multipole coil array 20; and is dimensionally confined in its the y-axis direction by the interior axial length of the interconnecting third ferromagnetic rod arm 50, and is bound by the preset gap distance "g" which separates the plane surface 24 of the multipole coil array 20 disposed on the first transverse support arm 40 from the plane surface 64 of the second transverse support arm 60. It is therefore solely within the confines of the circumscribed spatial passageway 70 that a region of contiguous magnetic field is generated and applied to the moving ion beam; that the gradients of the magnetic field can be controlled and adjusted as separate zones within the contiguous magnetic field; and that the distinct parameters of uniformity, parallelism, and ion trajectories for the charged particles in a moving ion beam become adjusted and controlled.

A Source of Electrical Current

A necessary part of the overall assembly 1 which is not shown by FIG. 8 is an on-demand means for introducing electrical current independently through each individual wire coil 22, which is then orthogonally disposed along the axial length of the first transverse support arm 40. Given the flow of an appropriate electrical current, each adjacently positioned and energized wire coil 22 will independently generate an orthogonally extending and individually adjustable magnetic field gradient of limited breadth. The plurality of adjacently extending, individual magnetic field gradients (of limited breadth) will collectively form and provide one contiguous magnetic field within the circumscribed spatial passageway 70; and the strength of each magnetic field gradient (of limited breadth) within the contiguous magnetic field can be 5 individually altered at will by varying the electrical current (given to the wire coil) to yield an adjustable and controllable magnetic field gradient over one zone of the contiguous magnetic field.

B. A Preferred Embodiment

Figure 9:
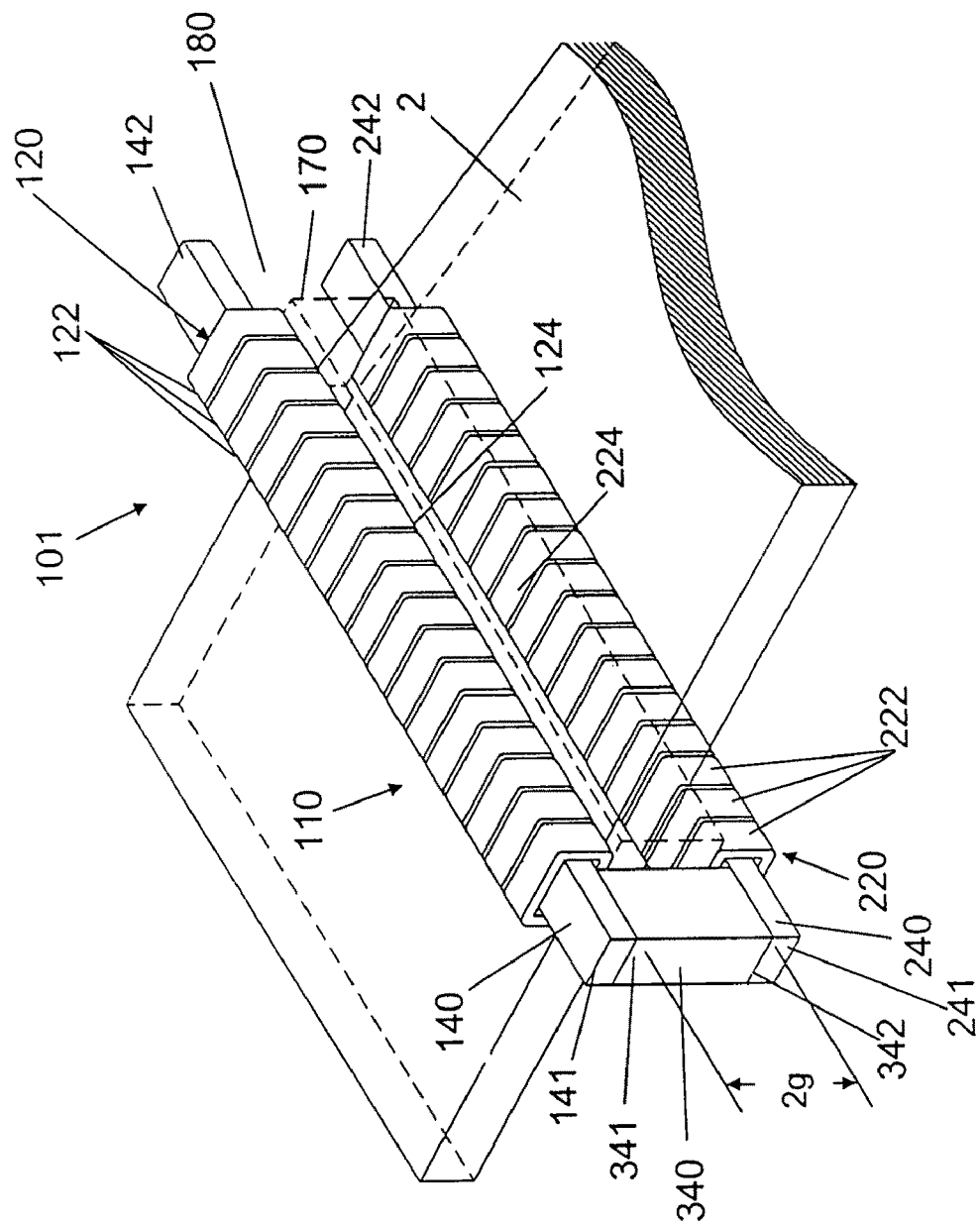
FIG. 9 presents a perspective view of one preferred structural construction for the electromagnetic controller assembly comprising the present invention.
Figure 10:
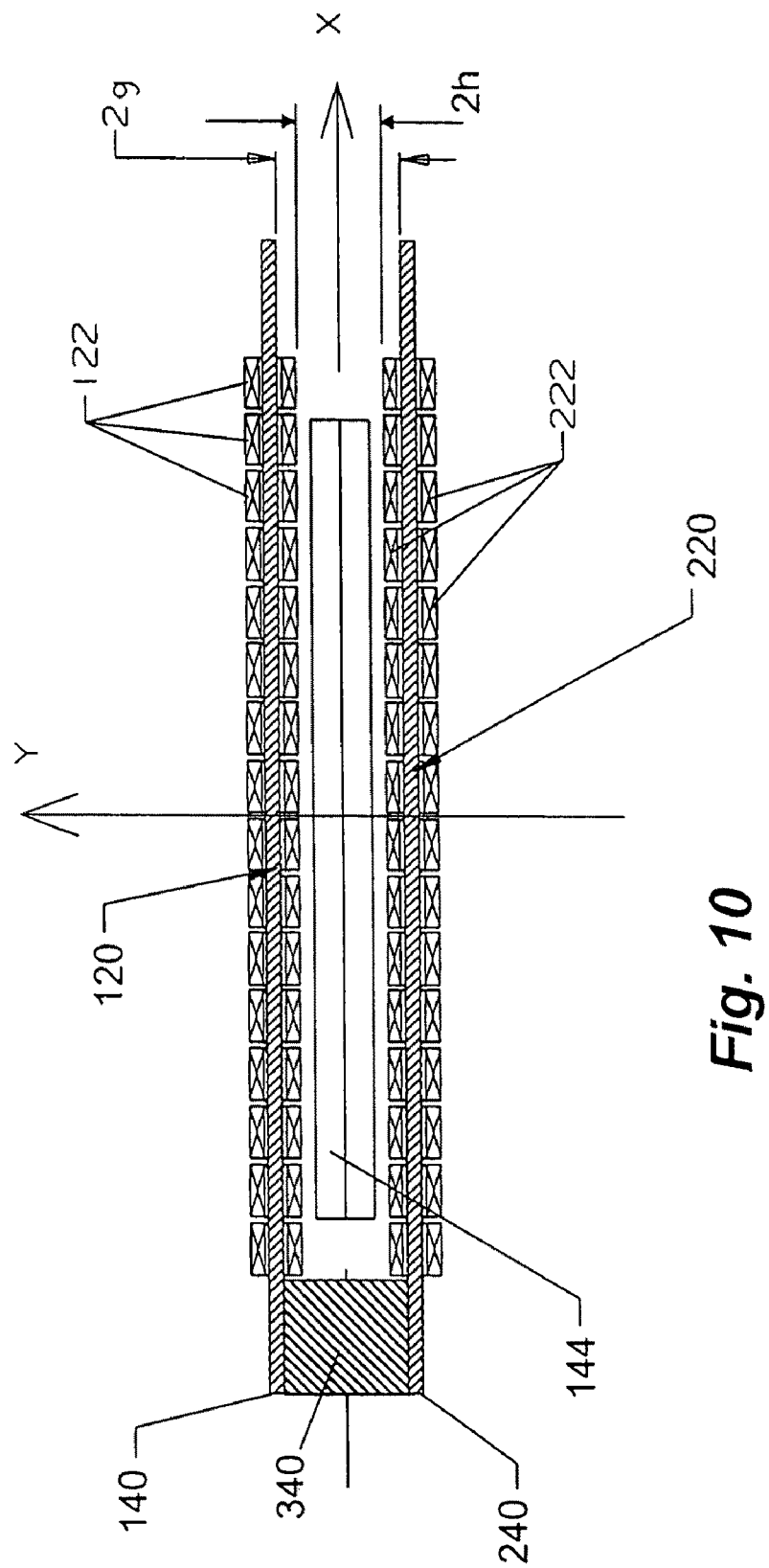
FIG. 10 presents a cross-section view of the preferred structural construction of FIG. 8.

A preferred embodiment of the present invention is exemplified and illustrated by the assembly of FIGS. 9 and 10, and constitutes a reproduction and incorporation of the simplest embodiment described above as part of its construction.

The Open-Ended Framework

As seen therein, the assembly 101 as a whole includes a substantially U-shaped ferromagnetic framework 110 formed by the interconnection of a first transverse rod arm or bar member 140, a second transverse rod arm or bar member 240, and a third rod arm or bar member 340 which lies in substantially perpendicular position to the transverse rod arms 140, 240.

The first transverse arm 140 is an elongated ferromagnetic rod of fixed length and girth; has two discrete rod ends 141, 142; and is formed of a ferromagnetic material. Similarly, the second transverse arm 240 is an elongated ferromagnetic rod of prechosen length and girth; has two discrete rod ends 241, 242; and is also formed of a ferromagnetic material. The second rod arm 240, however, rests at a preset distance from and in substantially parallel position to the first rod arm 140 in the assembly 110. In comparison, the third rod arm 340 has a short predetermined length and a fixed girth; has two discrete rod ends 341, 342; and is also composed of a ferromagnetic material. The third rod arm, however, is positioned substantially perpendicularly to and being tangibly attached to and magnetically joined with each of said first and second transverse rods.

The oppositely positioned first and second transverse rod arms 140, 240 are oriented to lie in parallel and across a preset gap distance "2 g" from each other; and these two transverse rod arms 140, 240 serve as two closed sides which bound and define the spatial volume interior within the U-shaped configuration of the framework 110. The third ferromagnetic rod arm 340 illustrated in FIGS. 9 and 10 has a markedly shorter length than the first and second transverse rod arms 140, 240; and is tangibly attached to and electrically joined at its rod ends 341, 342 to the rod end 141 of the first transverse rod arm 140 and the rod end 241 of the second transverse rod arm 240.

Two Deployed Multipole Coil Arrays

In the preferred construct illustrated by FIGS. 9 and 10, two discrete multipole coil arrays are deployed and utilized. A first multipole coil array 120 comprised of individual wire coils 122 arranged in series is disposed upon the first, transversely positioned, ferromagnetic rod arm 140 in the U-shaped framework 110. This first multipole coil array 120 is comprised of at least three wire coils which are wound independently upon and positioned adjacently at preselected sites over the axial length of the first elongated rod arm 140, such that each wire coil 122 is individually located and lies separated from its neighboring coil in the array at a preset distance. Also, each of the wire coils 122 in this first multipole coil array 120 is formed of electrically conductive matter; and each coil 122 is purposefully wound to lie orthogonal to the axial length dimension of the first transverse rod arm 140. As a consequence, the first multipole coil array 120 provides a series of individual, separate and adjacently positioned wire coils which are individually oriented and aligned with the x-axis of the assembly 110.

In addition, a second discrete multipole coil array 220 comprised of individual wire coils 222 arranged in series is disposed upon the second, transversely positioned, ferromagnetic rod arm 240 in the U-shaped framework 110. This second multipole coil array 220 is also comprised of at least three wire coils which are wound independently upon and positioned adjacently at preselected sites over the axial length of the second elongated rod arm 240, such that each wire coil 222 is individually located and lies separated from its neighboring coil in the array at a preset distance. Also, each of the wire coils 222 in this second multipole coil array 220 is formed of electrically conductive matter; and each coil 222 is purposefully wound to lie orthogonal to the axial length dimension of the second transverse rod arm 240. As a consequence, the second multipole coil array 220 provides a series of individual, separate and adjacently positioned single wire coils which are individually oriented and aligned with the x-axis of the assembly 110.

The individual wire coils 222 comprising the second multipole coil array 220 are also positioned on their supporting rod to correspond to and be aligned with their oppositely located counterpart wire coils 122 of the first multipole coil array 120. Accordingly, each wire coil 222 of the second multipole coil array 220 will desirably lie opposite to and directly across a fixed spatial gap distance from its oppositely placed, corresponding and aligned wire coil counterpart 122 in the first multipole coil array 120.

The Circumscribed Spatial Passageway

Also present between the first multipole coil array 120 (then disposed over the axial length of the first transverse rod arm 140) and the second multipole coil array 220 (then disposed on the second transverse rod arm 240) is a circumscribed spatial passageway 170 which encompasses the entirety of a ion beam traveling therethrough; and provides a confined and precisely defined volumetric region for adjusting and controlling the magnetic field gradients of a contiguous magnetic field which is applied to the moving ion beam.

As shown by FIGS. 9 and 10, the circumscribed spatial passageway 170 is bounded on one closed side by the plane surface 124 of the multipole coil array 120 disposed on the first transverse rod arm 140; on a second closed side by the plane surface 224 of the second multipole coil array 220 disposed on the second transverse rod arm 240; and is bounded on a third closed side by the perpendicularly placed axial length of the third ferromagnetic rod arm 340 in the U-shaped framework 110. In contrast, the fourth side 180 of the circumscribed spatial passageway 170 is completely open and unobstructed.

As shown by FIGS. 9 and 10, the circumscribed spatial passageway 170 is limited in its breadth dimension and in the x-axis direction by the linear length of the multipole coil arrays 120, 220; and is dimensionally confined in its height dimension and in the y-axis direction by the interior axial length of the interconnecting third ferromagnetic rod arm 150 and is bounded by the preset gap distance which separates the plane surface 124 of the multipole coil array 120 from the plane surface 224 of the second multipole coil array 220. It is therefore solely within the confines of the circumscribed spatial passageway 170 that a region of contiguous magnetic field is generated and applied to the moving ion beam; that the gradients of the magnetic field can be controlled and adjusted as separate zones within the contiguous magnetic field; and that the distinct parameters of uniformity, parallelism, and ion trajectories for the charged particles in a moving ion beam become adjusted and controlled.

A Source of Electrical Current

As before, a necessary part of the overall assembly 110, which is not shown by FIGS. 9 and 10, is an on-demand means for introducing variable electrical current independently through each individual wire coil 122, 222—which are then oppositely and orthogonally disposed along the axial lengths of the first and second transverse rod arms 140, 240. Given the flow of an appropriate electrical current, each oppositely positioned energized wire coil 122, 222 will generate an orthogonally extending and adjustable magnetic field gradient of limited breadth. The plurality of adjacently extending, individual magnetic field gradients (of limited breadth) will collectively form and provide one contiguous magnetic field within the circumscribed spatial passageway 170; and the strength of each magnetic field gradient (of limited breadth) within the contiguous magnetic field can be individually altered at will by varying the electrical current (given to the wire coils) to yield an adjustable and controllable magnetic field gradient over one zone of the contiguous magnetic field.

III. Requisite Parts and Optional Features of the Present Invention

The present invention is an electromagnetic corrector assembly which requires and utilizes a plurality of ferromagnetic support arms or bar members that are structurally and magnetically joined together to form the arms of an open-ended frame; has at least one multipole coil array of wire coils disposed over the axial length of a support arm of the open-ended frame; and is a construct which has no ferromagnetic matter which obstructs, closes or bridges the open-ended fourth side of the structure. A non-magnetic substructure, brace, prop or other underpinning to hold the assembly in its intended location might be required in practice.

The electromagnetic corrector assembly comprising the present invention has several distinctive structural components; some of which are required and essential components, and some of which are merely optional, yet highly desirable, structural features and aspects:

A. It is essential that all the support arms or bar members forming the open-ended frame be composed of ferromagnetic matter. However, it is immaterial to the invention whether a single ferromagnetic metal or alloy or a blending of different ferromagnetic metals or alloys are utilized for this purpose.

Also, each of the support arms or bar members used in forming the open-ended framework typically is a rod (or other bar-like structure) of fixed axial length and girth, and has two discrete ends. However, the particulars of the support arm's dimensional length and girth, and/or the support arm's linearity or curvature, and/or the support arm's overall geometry and symmetry (or non-symmetry) can vary markedly; and all these particulars will be typically be chosen to meet the individual needs of the user or the personal preferences of the manufacturer.

Accordingly, the scope and breadth of the present inventions allows for a wide range of variety and diversity in the making of an open-ended framework, as shown by the following:

(i) All the ferromagnetic support arms used in the open-ended frame need not be exactly alike or similar in axial length, in girth, in uniformity, or in symmetry;

(ii) All the ferromagnetic support arms employed in the open-ended frame need not have a similar geometry or overall configuration;

(iii) All of the ferromagnetic support arms forming the open-ended frame need not be comprised of one or even of the same chemical composition(s);

(iv) The number of discernible support arms employed to construct the open-ended framework is not limited; and (v) The general outline and overall shape of the open-ended framework formed via the serial juncture and interconnection of multiple ferromagnetic support arms is unrestrained and unconditional.

The Range and Variety of the Open-Ended Framework

This last point of information deserves some further description. It is envisioned that a variety of different and distinct open-ended frame structures can be constructed, the value and desirability of one particular configuration over another varying with the needs and capabilities of the manufacturer or user. FIGS. 11A-11F merely represent and exemplify the number of true possibilities.

As seen therein, FIG. 11A shows a five sided open-ended polygonal frame; FIG. 11B illustrates a four sided open-ended polygonal framework; FIG. 11C reveals a rectangularly shaped construct having two different internal spatial zones; FIG. 11D provides an oval shaped open-ended format; FIG. 11E shows a square shaped open-ended outline having two different interior spatial zones; and FIG. 11F illustrates an open-ended structure with a nearby ferromagnetic shield to reduce stray magnetic field.

It will be noted and appreciated also that the open-ended frame must functionally have at least one fixed internal gap space between its arms. Across this gap distance, the magnetic field is expected to have its peak value, determined by the sum of all the currents in all the coil windings. If, for any reason, this gap distance is subdivided by a tangible piece of ferromagnetic material into two or more smaller gap spaces; and one of these smaller gap spaces is positioned at one end of the frame, but lies beyond the limits of the circumscribed spatial passageway—such a construction format and embodiment nevertheless is still within the same basic concept and scope of the present invention.

In a majority of embodiments, however, it is expected that a substantially U-shaped structure formed by the juncture of three individual ferromagnetic rod-like support arms will be employed. In this typical U-shaped framework, the first and second transversely positioned support arms typically are elongated straight rods having a linear length considerably greater than that the axial length of the interconnecting and perpendicularly positioned third rod arm.

It will be recognized that, in these U-shaped frame embodiments, that the rod ends of the third support arm are tangibly attached to and physically joined with one end of each of the first and second elongated support arms in the framework; and that this third support arm not only mechanically interconnects the first and second support arms, but also functions to provide a magnetic short-circuit between the first and second support arms when the assembly is electromagnetically energized.

The same circumstances and requirements exist for each of the alternative framework configurations illustrated by FIGS. 11A-11F respectively. In each of these alternative framework constructions, all the identifiable arms or bar members used to support a multipole coil array in the open-ended frame are mechanically joined to the other support arms (i.e., those bars which are not used to support a multipole coil array) such that all of them become interconnected in series; and the resulting unitary framework as a whole functions to provide a magnetic short-circuit between the interconnected support arms when the assembly is electromagnetically energized.

Magnetic Flux

Magnetic flux is defined as the product of the average magnetic field multiplied by the perpendicular area that it penetrates. It is a mathematical quantity of convenience in the statement of Faraday's Law; and in those applications where a magnetic field is introduced into a circumscribed air space, the area used in defining the flux is the plane perpendicular to the direction of the magnetic field.

As seen in FIG. 9, within the circumscribed passage 170, the magnetic flux density is greatest near the open end 180 of the assembly 110; but (according to Ampere's law) all this flux must complete a circuit bounded by the current in the coils 122 and 222, and therefore all the flux must pass through member 340. Thus within this short third arm, or multiple additional short arms, of the open-ended framework and multipole arrangement of the present invention, the magnetic flux is directly proportional to the entire integrated contiguous magnetic field generated by the multipole coil array(s) then disposed over one or more transverse support arms of the frame and which is introduced over and applied perpendicularly to the mid-plane of the circumscribed spatial passageway (through which the ion beams travels).

However, the magnetic flux present between the elongated transverse support arms lying in parallel (see 140 and 240 in FIG. 11) is neither constant nor uniform over the length of the framework. Consider, for example, a point on arm 140 about one quarter distance from member 340 to open end 142, where the local flux density between the transverse arms 140 and 240 may be about one quarter that at the open end of the framework—whereas flux within the ferromagnetic arm at this location comprises the integrated amount of flux that links arms 140 and 240 on the side away from member 340 and closest to end 142, but excludes that flux linking these arms on the side closer to 340. The former flux is much greater than the latter, and the flux within the arm at this location is over 90% of the peak flux found. Thus, within the ferromagnetic material of the arms shown by FIG. 11, the magnetic flux is greatest within the short third arm, and will decrease in value within the arms towards the open end of the framework. This behavior is apparently opposite to the behavior of the flux density within the passage 170, which increases with distance from member 340. This behavior conforms with Ampere's Law.

Relative Permeability

Magnetic permeability of a material is a relative term and is an approximation of the multiplication of the applied magnetic field that can be achieved by the presence of one specific material, in comparison to vacuum. "Ferromagnetic" materials, such as iron, have high permeability. The measured value depends upon the applied magnetic field, but in a practical device one is concerned with magnetic fields in the range between about $1 \times 10^{-3}$ T up to 1 T. Thus as representative and illustrative examples—at a given magnetic flux density of 0.002 T—the relative magnetic permeability of pure iron is measured to be in excess of 25,000; and that of low-carbon steel, such as grade 1006, is approx 6,000.

One is not here concerned with the permeability values of materials at low magnetic field levels (i.e., less than about $1 \times 10^{-3}$ T). Rather, in the practical context of this invention, one requires a relatively high permeability material at a magnetic field around 1 T; and low-carbon steel is an ideal material offering high permeability under these conditions.

In the present invention, the support arms of the open-ended framework all characteristically are formed of a material having a relatively large or high magnetic permeability. The magnetic field generated within this framework is not uniform, and will be greatest near the short arm (or arms) farthest from the open end of the framework. As a result of the higher magnetic field, the permeability may on occasion fall well below 1000 in value; but a substantially correct functioning of the device requires only that the permeability value of the material forming the short third arm be substantially greater than that of the material lying adjacent the open end of the framework (where the permeability value is 1).

While a theoretically ideal device would be made of material of infinite permeability, the consequences of using materials having finite permeability are minor, provided the design of the device is executed so as to prevent the magnetic fields within the ferromagnetic framework from exceeding a value at which the permeability falls below about 1000—an event which occurs near 1.5 T in low-carbon steel. The effect of the finite permeability is a barely perceptible distortion of the magnetic field; and an increase of less than 1% in the required electric current is needed to achieve an acceptable level of magnetic excitation. However, increasing the field above about 1.8 T in low-carbon steel will cause a rapid increase in measurable distortion of the magnetic field shape.

B. It is essential that there be at least one multipole coil array of individual wire coils disposed in series upon a first ferromagnetic support arm or bar member of the open-ended framework. This multipole coil array must be comprised of at least three wire coils wound independently upon and positioned adjacently at preselected sites over the axial length of the particular (preferably elongated) support arm; and each wire coil in the series must be separated at a small preset distance from its neighboring coil within the array. Also, each of the wire coils in the multipole coil array is to be formed of an electrically conductive material and is to be wound to lie orthogonal to the axial length of the support arm upon which it lies.

Optionally however, there may be (and in the preferred embodiments always is) at least a second discrete multipole array of wire coils in series placed around and disposed over a second ferromagnetic support arm or bar member in the open-ended frame structure. When present, this second wire coil array should be positioned to lie parallel to and in a pre-defined alignment with the wire coils of the first multipole coil array disposed upon the first rod arm. Usually the two coil arrays will be aligned with each other, but a staggered arrangement is also useful.

This second multipole coil array is also comprised of at least three wire coils, each of which is wound independently upon and positioned adjacently at preselected sites over the axial length of the second (preferably elongated) support arm; and each wire coil must be separated by a set small distance from its neighboring coil in the array. Also, each of the wire coils in this second multipole coil array is formed of electrically conductive matter and is wound to lie orthogonal to the axial length of the second support arm.

Accordingly, when present in the construct, each wire coil of the second multipole coil array will desirably lie opposite to and directly across a spatial gap distance from its oppositely placed, corresponding, and aligned wire coil counterpart in the first multipole coil array.

C. As another optional feature within the typical U-shaped frame of the simplest and preferred embodiments described herein, there may be one or more discrete wire coil(s) disposed around the interconnecting third ferromagnetic support arm or bar member in the open-ended frame structure. Thus, if and when the optional wire coil(s) appears as a component part of the construction, the wire coil(s) will be formed of electrically conductive matter; will be wound independently upon the axial length of the third ferromagnetic support arm; and will lie orthogonal to the axial length of the third rod. The purpose and intended function of the optional wire coil(s) disposed upon the third ferromagnetic support arm is to generate and control a uniform dipole component of magnetic field over the spatial passageway (see below). The overall field may be viewed as a superposition of a dipole field upon the contiguous field generated by the multipole coil arrays. This will provide an additional adjustable overall beam deflection, for further control of the beam direction.

D. Finally, in each and every embodiment of the present invention, a circumscribed spatial passageway will exist for the transit of the moving ion beam within the assembly. In the U-shaped framework, this circumscribed passageway is a volumetric space bounded within the spatial gap distance between the transverse support arm(s), and by the axial length of the multipole coil array(s).

Note that the circumscribed spatial passageway is always a subset of the preset gap distance—i.e., the spatial dimensions and volume defined by and internally encompassed by all the ferromagnetic rod arms of the open-ended framework. The circumscribed spatial passageway is also preferably smaller in size and volume than the total region of magnetic field provided by the array(s) of wire coils disposed upon one or more ferromagnetic support arms or closed sides of the open-ended frame configuration.

IV. Beam Control Via Use of a Contiguous Magnetic Field

The manner of using the present invention may be more easily understood and appreciated by considering the details of the U-shaped assemblies described above as illustrated by FIGS. 12-15 respectively.

Figure 12:
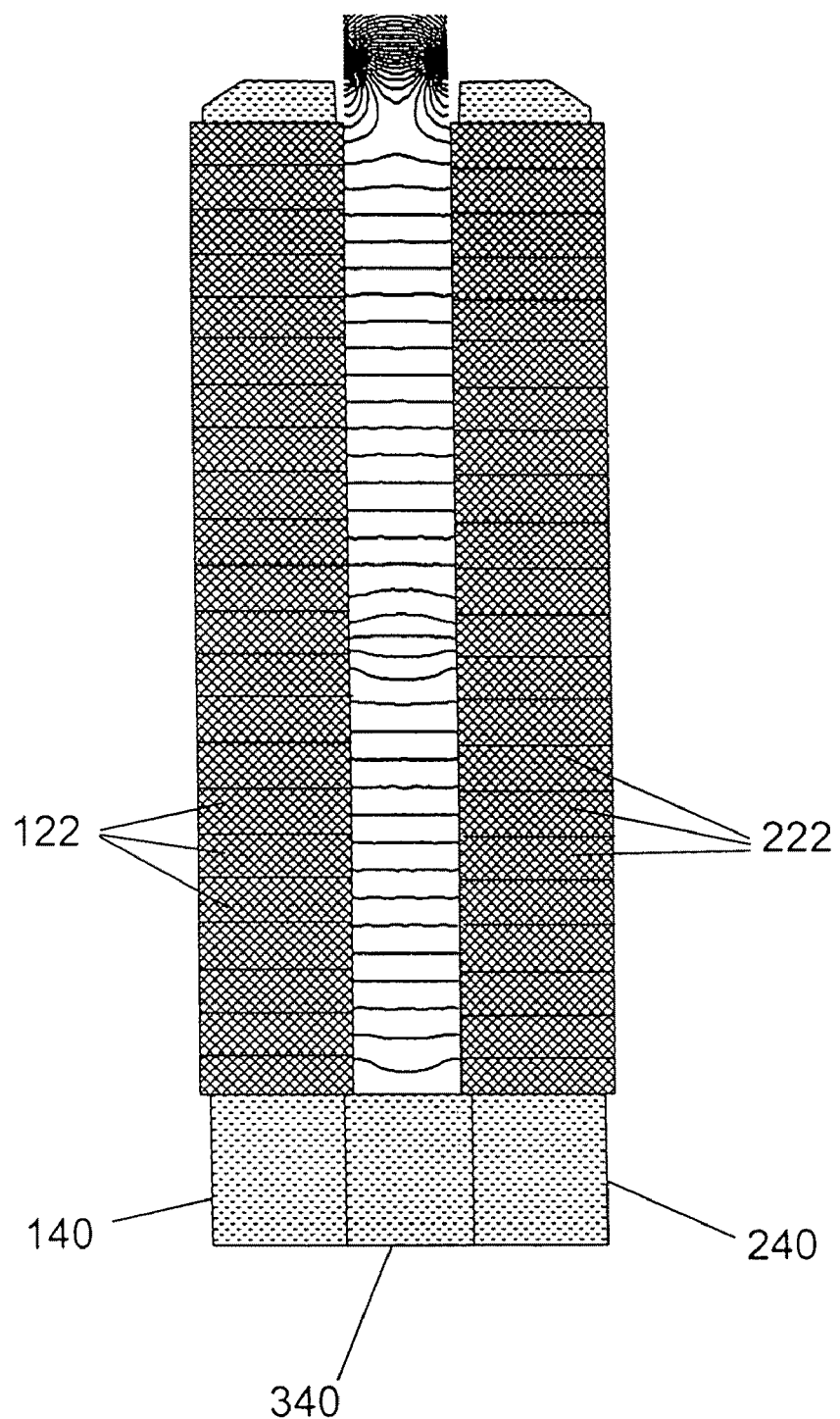
FIG. 12 shows a series of contours of magnetic field strength which are created when electric current is passed through the multipole coil array(s) of wire coils lying along the elongated transverse arms of a U-shaped construct.

As shown by FIG. 12, when electric current is passed through the multipole array(s) of wire coils 122, 222 lying along the elongated transverse rod arms 140, 240 of the U-shaped construct, a series of magnetic field gradients are created; and oppositely positioned pairs of wire coils in the different multipole coil arrays may be electrically connected in series. Although the individual electric currents may differ in magnitude (for reasons expounded below), the current variations nevertheless will be of a smaller magnitude than the average current in all the coils.

It is convenient to speak of a common component of current $I_0$, and of individual corrections $\rho I_k$ to the current in each wire coil of the discrete array. Also, there are several possible arrangements which achieve the same ends, namely: the generation of an underlying constant magnetic field gradient between the long bar members, with the resultant magnetic field rising from zero at the closed end of the U shape and rising to a maximum value by the open end, the field being oriented from one bar member to the other; upon which is superimposed an array of variable and individually adjustable field gradients varying transversely to the direction of travel of the ion beam. Other equivalent descriptions exist.

This generated magnetic field is forced to zero value at one side of the traveling beam by the presence of the connecting third ferromagnetic bar member, which is physically joined and magnetically linked to the ends of the two longer-length transverse rod arms in the U-shaped assembly. The magnetic field will vary in strength from zero value at this third short arm location to its maximum field strength value at the other ends of the two adjacent, longer-length rod arms; and then the magnetic field will fall rapidly to near zero value again a short distance outside the bounded gap region lying within the spatial interior of the U-shaped construct.

The multipole array(s) of wire coils disposed on one (or both) of the transverse (longer-length) rod arms provide a fixed region of contiguous magnetic field, which exceeds the width of the traveling ion beam. Therefore, if the wire coils in the respective arrays on either side of the bounded gap region are all identical in winding size and their applied electric currents are held equal—but the current flow in the first array around the first rod arm is in an opposite direction to the current flowing around the second array on the second rod arm—then, the contiguous magnetic field will tend to rise linearly in value within and over the spatial volume or gap distance existing between the two transverse rod arms, from one end of the rod to the other. In other words, within the bounded gap distance, each magnetic field gradient is held at a constant value across the entire width of the ion beam as the beam travels through the contiguous magnetic field of increasing value generated across the transverse rod arms of the U-shaped construct.

Note however, that if the electric currents passing into the individual wire coils are not held exactly equal, then the individual magnetic field gradients will contain corresponding inequalities and variations. Thus as shown by FIG. 12, the contours of an equal magnetic field strength show that the field increases almost linearly from zero value (at the ferromagnetic shorter-length arm boundary 340) to a maximum field strength value at the opposite open end (or fourth side) of the U-shaped construct; and then falls in value rapidly at locations immediately outside and beyond the open end of the assembly.

FIG. 12 shows contours of magnetic field magnitude, spaced at equal intervals of field strength. These contour lines do not illustrate the direction of the magnetic field—although as a result of the overall geometry, these lines do coincidentally approximately align with the magnetic field within the bounded gap region. Close scrutiny of FIG. 12 will reveal a slight upset in the uniform array of contours, which is typically caused by one of the oppositely positioned wire coil pairs carrying a 20% increase in current. It is thus clear that a local change in the electric current concomitantly causes a corresponding local change in the generated magnetic field gradient. The nature of the correspondence is critically important to understand; the magnetic field gradient at any point is determined and controlled by the local electrical current in the wire coils at that particular position.

Figure 13:
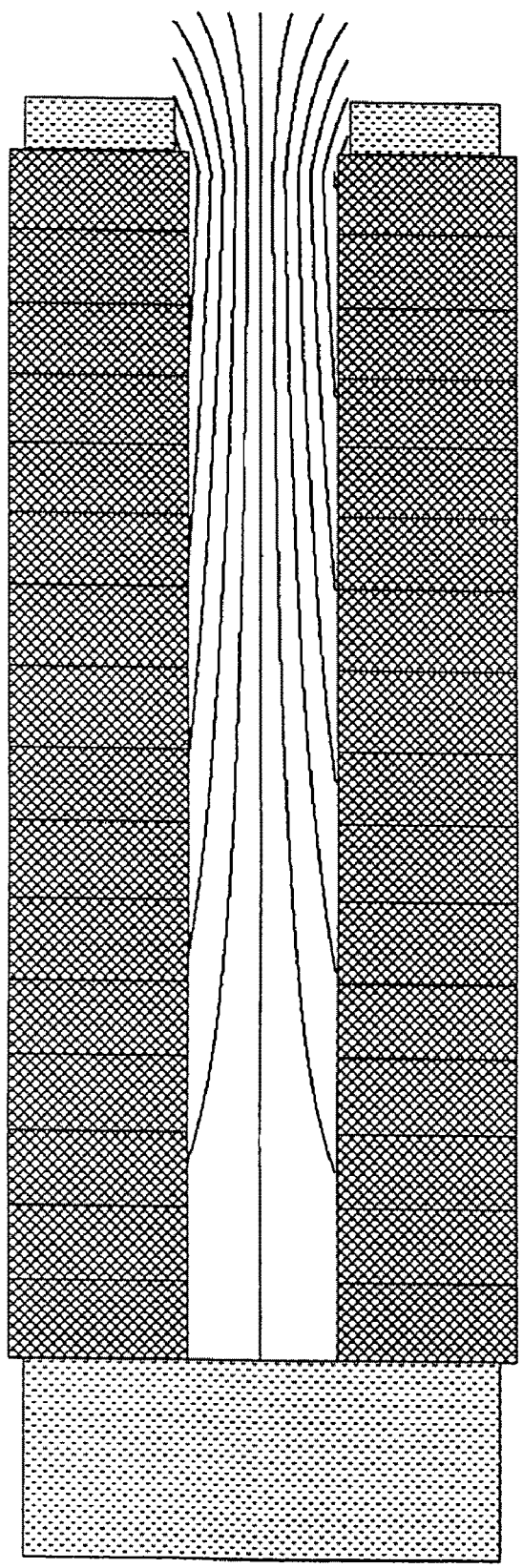
FIG. 13 is a view of the multipole corrector assembly which shows a plot of magnetic equipotentials.
Figure 14:
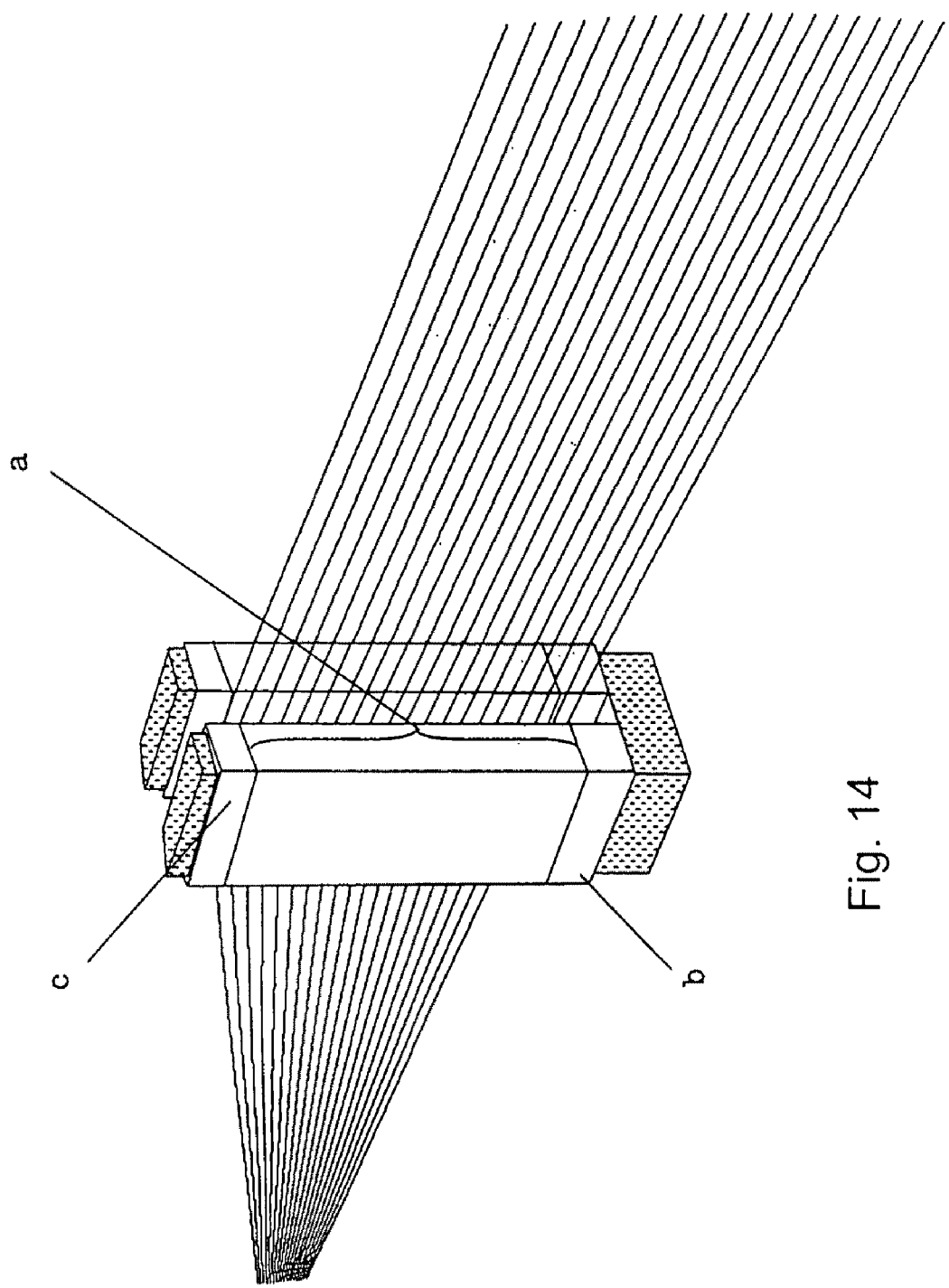
FIG. 14 is a perspective view of the U-shaped electromagnetic corrector multipole structure showing the relationship between the beam and the spatial region of controlled magnetic field, and also shows that the traveling ion beam is deflected.

FIGS. 13-14 respectively also illustrate and provide many useful details about the present invention.

For instance, FIG. 13 is a view of the multipole corrector assembly which shows a plot of magnetic equipotentials. The magnetic field direction is always orthogonal to these lines, and its strength is inversely proportional to the spacing of the lines.

FIG. 14 is a perspective view of the U-shaped electromagnetic corrector multipole structure; and shows the relationship between the traveling beam and the spatial region of controlled magnetic field. Initially, it will be noted that the volume occupied by the traveling ion beam must be smaller than the volume of controlled magnetic field bounded by the wire coil arrays and the magnetic short-circuit of the intervening third support arm in the U-shaped construct. This places the entirety of the traveling beam under the control of the separate coil sections of the multipole arrays.

It will be noted that the wire coil arrays illustrated by FIG. 14 are configured as three separate and distinct sections. Section "a" of the coil array will collectively control beam collimation, and the individual wire coils therein will control current uniformity. In contrast, the wire coils constituting Section "b" in the array will control overall beam deflection; and additional turns of wire in these particular coils can be useful in certain circumstances and applications. Lastly, the wire coils of Section "c" serve to smooth he termination of the field and are used to avoid creating a local bump in the beam.

FIG. 14 clearly shows that the traveling beam is being deflected by the U-shaped assembly. The local deflection of the ion beam is determined by the total current flowing around the bars in the region between the trajectory being considered and the magnetic short circuit. In fact, the deflection at any point in the ion beam is determined by the total current flowing around the bars in the region between that point and the magnetic short circuit.

In addition, FIG. 14 also shows that the apparatus focuses the ion beam; and if the current direction and magnitude are appropriate for use, the assembly can focus an ion beam diverging from a point (real or virtual) and collimate it, in a manner analogous to a condenser lens in light optics. The focusing strength of the lens is calculated below.

Also, in actual practice, if the ferromagnetic material of the U-shaped frame is low-carbon steel, and the thickness of the bars is sufficient to avoid saturation of the field, then the permeability of the steel can be relatively constant with a value of 2500 or more. Under these conditions, the magnetic field in the spatial gap between the steel bars and the wire coils of the arrays can be determined with a precision of better than 1%, by assuming the permeability to be infinite.

V. The Mathematical Underpinnings of the Present Invention

A mathematical analysis will reveal the theoretical underpinnings and support for the present electromagnetic corrector assembly and method. To simplify the mathematical analysis (though this is not required in the actual practice), one can assume that the model system is mirror-symmetric in the midplane, and the magnetic field under discussion lies in the midplane. One can further assume that the gap distance existing between the transverse rod arms of the U-shaped structure is significantly less than the width dimension of the rod arms in the beam direction, since this allows one to temporarily neglect the variation in the field where the beam enters and exits the device.

Also, in contrast to many prior art systems which use ferromagnetic pole boundaries and wire coils located at a distance from the traveling ion beam, the disposition of the multipole array(s) of wire coils upon the transverse support arms in the present U-shaped structure is made in order to effectively bound and define the spatial volume through which the ion beam moves when the beam passes within and through the assembly. This unique arrangement provides a quantitative and accurate relationship between the current density in the wire coils and the individual field gradient in the beam region, as opposed to directly controlling the magnetic field (as in the prior art). Thus, for the present invention, the magnetic field at any point is not determined by the local current density; instead, it is determined by the integral of the field gradient from a known boundary, and the known boundary is deliberately placed and precisely fixed.

The Magnetic Field Gradients and the Contiguous Magnetic Field

For purposes this detailed description, the ion beam is presumed to be traveling generally in the z-direction; and the x- and y-directions are transverse to it, as defined above. Equations are in MKSA units. However, departing from the previous use of coordinates, the x-origin is now aligned with the edge of the magnetic short circuit that faces towards the beam.

Current Uniformity Regulation

One can write mathematical expressions for the magnetic field at any point within the apparatus where the beam may pass.

First one must consider the field gradients. The field gradient in the center of the device can be adjusted as a function of x. The gradient within the beam is given by:

$$\frac{\partial B_y}{\partial x} = \frac{\mu_0}{g} J_x(x) \qquad \text{[Equation I]}$$

where 2 g is the gap between the two ferromagnetic bars (or a single ferromagnetic bar and the ferromagnetic boundary plane), and $J_x$ is the number of ampere turns in each coil per unit length in the x-direction, assuming all coils are similarly excited.

When only one wire coil or pair of coils is excited, this expression approximates the peak gradient caused by this coil, provided the coil width exceeds g, and this field gradient will fall smoothly to zero on either side. If the coils are narrower, this relationship will still hold, provided several adjacent coils are similarly excited. The magnetic field required to deflect an ion of mass M, charge q and kinetic energy U on a trajectory with a radius ρ is given by $$B\rho = \sqrt{\frac{2MU}{q}} \qquad \text{[Equation II]}$$

One assumes that the z-extent of the multipole device is defined by the overall z-extent of the coils. In reality however, this distance may be slightly less and should be modeled with a finite element computer code for accuracy. This dimension is named $L_m$ and is not tightly constrained. For discussion purposes we can assign it a value of 200 mm.

Therefore the angle through which a given field B would deflect an ion of mass M passing though a device of effective length $L_m$ is $$\theta \approx L_m B \frac{q}{\sqrt{2MU}} \qquad \text{[Equation III]}$$

and the focal length is given by $$\frac{1}{f} = L_m \frac{\partial B_y}{\partial x} \frac{q}{\sqrt{2MU}} = \mu_0 L_m \frac{J_x}{g} \frac{q}{\sqrt{2MU}} \qquad \text{[Equation IV]}$$

It is never desired in this application to focus the outgoing beam or beamlets sufficiently such that the trajectories are caused to cross each other.

The variation in beam current density that the device can produce can be estimated with good accuracy, and from a beam profile measurement the change in coil currents required can be explicitly calculated. $J_b$ denotes the beam current density, and $\Delta J_x$ denotes the change in the current density in the coil array windings of the corrector assembly. If the uncorrected beam has a current density $J_{b0}(x)$ at a plane distant $L_t$ downstream of the device, projected along the direction aligned with the long transverse axis of the beam, then the corrected beam current density $J_{b1}(x)$ is approximately given by $$J_{b1}(x) \approx J_{b0}(x)\left(1 + \Delta J_x(x)\frac{\mu_0 L_t L_m}{g}\sqrt{\frac{q}{2mV}}\right)$$ [Equation V]

provided that the variation along the x-direction is only significant on a scale greater than approximately g.

In actual practice, one has 2 n coils, where each coil of the jth coil pair carries $I_j$ ampere turns of current and has width $w_j$. If at the point x, one considers a point $\delta x$ from the start if the kth coil, where $\delta x < w_j$, one can write:

$$\frac{\delta B_y}{\delta x} \approx \frac{\mu_0}{g}\frac{2I_k}{w_k}$$ [Equation VI]

Again, in practice, the beam profile is measured and the current in each of m adjacent beam sections is recorded, where each beam section is aligned with a coil pair. There may be some coil pairs beyond the edges of the beam, but nevertheless one can label the coil pairs and the beam sections so that the kth section of the beam profile is aligned with the kth coil pair.

Then, one can write $$J_{b1k} \approx J_{b0k}\left(1 + \Delta I_k \frac{2\mu_0 L_t L_m}{w_k g}\sqrt{\frac{q}{2mV}}\right)$$ [Equation VII]

In words, Equation VII states: the corrected beam current density in the kth segment is equal to the initial beam current density multiplied by the term in parentheses, which is a linear function of the change in current in the appropriate coil or coil pair.

This equation allows one to quickly make a set of adjustments $\Delta I$ whereby all the $J_k$ values become the same (within practical limits) or alternatively, fit a desired profile. The right-hand expression equation may well be adjusted empirically by a constant calibration factor for fast and accurate adjustment. However, the explicit magnetic rigidity term on the right of this equation allows us to accurately predict the required adjustment for any ion of any mass, energy, or charge state, once calibration has been performed.

It may be objected that if any of the required adjustments is large, the overall alignment of each coil with its corresponding beamlet is upset after adjustment. This is true, but using theory further outlined below, this effect can be substantially offset.

Parallelism (Collimation)

One may also assume that the beam reaching the multipole device is diverging from a (real or virtual) point at a distance $L_s$ before the center of the multipole. By definition, therefore, if the multipole produces a quadrupole field which is focusing in the x-direction with a focal length of $L_s$, the resulting beam ions will be in parallel.

From Equation IV, the current density $J_s(x)$ in the coils that is required to produce a focal length of $L_s$, and thus produce a beam having parallel ion trajectories is $$J_s = \frac{g\sqrt{2MU}}{\mu_0 q L_m L_s}$$ [Equation VIII]

For g=0.06 m, $L_m$=0.4 m, $L_s$=2.0 m, and for arsenic at 100 keV, $J_s$=23520 ampere turns per meter, or about 24 ampere turns per mm.

It is possible to combine these two functions in one. The electric current in each of the coils is computed as the algebraic sum of two components: the first, common to all the coils, being the current required to satisfy Equation VIII; and the second being a (small) correction to this current, to produce a uniform current density profile in the beam.

It is usually impossible to simultaneously achieve perfection in every beamlet, but a good approximation can be achieved as follows: First, Equation VIII is satisfied, then small adjustments to the coil currents are made to optimize uniformity; however care is taken to ensure that the sum of the m adjustments to the current calculated using Equation VII all add to zero, thereby minimizing the average change in the beam collimation. This is equivalent to ensuring that all corrections made to the individual currents are weighted to preserve the mean current density unchanged. Algebraically, this condition is simply that $$\sum_{k=2}^{n-1}\Delta I_k = 0$$ [Equation IX]

which can be met simply by adding an equal small correction to all n-2 values of $\Delta I_k$.

Trajectory Angle and Overall Beam Direction

One can now show how the overall beam direction may be controlled, and how the specific requirement that within the part of the multipole occupied by the beam can be met—by using the present invention.

Initially it will be noted that, in the prior art uniformity regulator device of N. R. White identified in the '713 patent identified above, the magnetic field was not explicitly controlled, and in fact was undefined, since $$B_y(x) = \frac{\mu_0}{g}\int J(x)dx$$ [Equation X]

and, in that particular apparatus, there was no defined boundary to determine the unknown constant of integration. In fact, the precise value of magnetic field at any point in the prior art device depends upon the presence or absence of nearby objects with significant permeability.

By contrast, as in the prior art Panofsky quadrupole (or as in any derivative device, such as those of Enge) which comprises a complete rectangular magnetic yoke, the yoke component provides sufficient boundary conditions to determine the field. However, to meet this condition, these prior art devices also force the user to accept and meet a specifically required condition: that the coils wound around the ends of the frame carry equal and opposite ampere turns to the coils wound around the long members, as is exemplified by U.S. Pat. No. 6,993,507.

Only by accepting this overtly required condition—namely that the integral of the ampere turns around the complete magnetic yoke integrate to zero—can the integral equation become definite.

In contradistinction, the present invention meets the goal of providing precise determinacy of the magnetic field; and goes even further in its operation, by requiring this field to be non-zero in the region within the device occupied by the beam. The instant invention thus avoids the requirement to monitor and control the integral of the ampere turns in the device to zero, and it approximately halves the complexity and power dissipation required to operate such a device.

The instant invention achieves this by the presence of the third shorter-length ferromagnetic bar member, which serves as a magnetic short-circuit, at the closed end of the U-shaped structure, outside the spatial region occupied by the traveling beam. As noted above, one assumes the permeability to be infinite in this discussion.

At the edge of the magnetic short circuit, one can apply the boundary condition that the tangential component of the H field $\approx 0$, hence $B_y(0) \approx 0$, and write a definite integral $$B_y(x) = \frac{\mu_0}{g} \int_0^x J(x) dx \qquad \text{[Equation XI]}$$

and in terms of the actual coil currents:

$$B_y(x) \approx \frac{\mu_0}{g} \left( \sum_{j=1}^{k-1} I_j + I_k \frac{\delta x}{w_k} \right) \qquad \text{[Equation XII]}$$

(where the approximation arises from the possibility that neighboring coils do not carry the same current density and are close enough to perturb the field). Using symmetry arguments, one can state and further write that at the midplane, and therefore within the region bounded by the kth coil pair $$B_x = -\frac{\mu_0}{g} I_k \frac{y}{w_k} \qquad \text{[Equation XIII]}$$

Also by symmetry, in the midplane, $$B_z = 0 \qquad \text{[Equation XIV]}$$

One can therefore write the beam deflection $\theta$ in the xz plane of a trajectory passing through the device at any position x as $$\theta \approx \frac{L_m q}{\sqrt{2MU}} \frac{\mu_0}{g} \int_0^x J(x) dx = \sqrt{\frac{q}{2MV}} \frac{L_m \mu_0}{g} \left( \sum_{j=1}^{k-1} I_j + I_k \frac{\delta x}{w_k} \right) \qquad \text{[Equation XV]}$$

VI. The Operational Capacities and Limits of the Present Invention

The operational capacities and limitations of the present invention, the electromagnetic controller assembly, can now be analyzed and evaluated in terms of these known magnetic field and field gradient components. The analysis will make clear that, within certain operational limits, the open-ended apparatus can provide independent control of and separate adjustments for current uniformity, for collimation, and for the trajectory angle of the traveling ion beam.

The adjustments and/or correction(s) which can be made using the present invention have a resolution limited by the number of individual and separate wire coils disposed in series which constitute the array; by the width dimension of the spatial gap existing between the two long support arms and wire coil arrays through which the ion beam passes; and by several other minor correction factors. The spatial resolution of the U-shaped assembly can be no better than the pitch of the wire coils; and can be no better than approximately the maximum distance between any part of the ion beam and the closest coil winding, and in a practical situation will typically be slightly worse.

Within these outer limits, a person can operate the controller assembly described above to adjust and control the parameters of current uniformity, collimation, and trajectory angle; but with (n) independent power supplies powering (n) pairs of coils, one can effectively make no more than (n) different independent adjustments—and practical constraints may reduce this theoretical number.

Thus, as shown by the sequence of manipulative steps recited by the Flow Scheme of FIG. 15, if the beam falls within the spatial gap bounded by (k) pairs of coil windings, where 2k>n>k, one can make (n) independent adjustments—of which (k) adjustments affect differential uniformity and direction of beamlets within the beam. Furthermore, of the remaining current adjustments, those individual coil windings lying nearest to the closed side (which serves as the magnetic short-circuit for the framework) will affect the total deflection of the beam as a whole; while those individual coil windings located nearest to the open ended side of the framework will have no material effect at all on the direction of the ion beam.

Perfect adjustment (within the permitted resolution) of both collimation and current density would require a total of 2k independent adjustments, and some of these would have to be located at a different part of the ion beam; nevertheless, one can achieve a very useful, but less than perfect, degree of adjustment with less effort.

For example, one can make k-1 independent adjustments of relative uniformity, which is sufficient to achieve the best overall current uniformity within the permitted resolution of the device; and also concurrently adjust the direction of any two selected beamlets to have a desired directional alignment (which is typically parallel to a predefined axis). Given a suitable overall system design, the deviation of any remaining beamlet within the beam from this direction is unlikely to exceed a few milliradians, the maximum error being determined by the overall geometrical layout.

Further improvement of collimation could also be achieved in an entirely different way—via the use of a second discrete assembly in pre-arranged combination with the first. This extends the technique disclosed in prior art FIG. 1A, where several multipoles were used. By placing a second (preferably U-shaped) multipole corrector assembly (or a simpler multipole device) at a different position, preferably upstream, in the ion beam pathway, this positionally arranged combination of two electromagnetic controller assemblies working in tandem can provide the independent adjustments needed. Under these circumstances, because the second controller assembly is located at a different plane position in the ion beam pathway, the relationship between collimation and uniformity correction controlled by the second assembly is also different (primarily because the effect on uniformity of a given deflection change depends on the distance between the multipole device and the beam target plane).

In practice, the second controller assembly would probably be placed upstream, and would contain a much smaller number of coils. The upstream controller assembly would have relatively greater effect upon current density than upon collimation, while the downstream controller would have relatively greater effect upon collimation than upon current density; suitable adjustments can therefore correct and control both current density and collimation.

VII. An Exemplary Ion Beam Tuning Sequence

As merely an aid and guide for effectively using the electromagnetic controller assembly comprising the present invention, a flow scheme illustrating the desired sequence of steps for performing the methodology and technique is presented by FIG. 15. It will be recognized and appreciated, however, that the particular flow sequence of steps shown by FIG. 15 is not compulsory; and that the user may optionally alter the pattern of individual adjustments to suit his specific needs or convenience.

Sequence A: The Adjustments for Beam Travel Direction and Profile

Step 1: Although not mandatory, most ion implantation systems use an analyzing magnet to select the desired ion beam species. The approximate settings $I_0$ for the wire coils in the multipole coil array(s) of the electromagnetic controller assembly can be pre-calculated from Equation IX for $J_s$, and will scale in direct proportion to the current required in the analyzer magnet (provided that non-linear behavior arising from excessive magnetic field in the steel of either device does not distort their behavior). Initial adjustment of the beam's direction using the controller assembly is therefore easy, and such an initial adjustment will provide a roughly collimated beam directed in approximately the correct travel direction.

Step 2: The beam profile can be measured by a traveling Faraday cup or an array of fixed cups. A traveling cup is preferable to avoid systematic calibration errors. But for ease of understanding, one assumes here that an array of identical Faraday cups is placed in the target plane. One Faraday cup is centered on every x-coordinate at which a wire coil or pair of wire coils is centered in the multipole coil array.

To eliminate errors, each Faraday cup should be preceded by a grounded entrance aperture of rectangular shape, the width of each aperture being accurately identical, and having a width which is a fraction of the width of each coil of the multipole coil array in the controller assembly. The height of each aperture and of the Faraday cup must exceed that of the ion beam, or the measurement will be invalid. Current density at an x-coordinate is obtained by dividing the measured ion beam current by the width of the aperture; however if all apertures are identical this step can be omitted, and the measured currents can be used directly.

After the measurement is complete, the mean value of the measured currents in the Faraday cups is computed. If the desired beam profile is uniform, the error at each measurement point is the difference between the measured value and the mean. If the desired beam profile is non-uniform, then the error value must be computed to suit the desired function.

Step 3: From this profile, the beam width is computed. There is a relationship between the beam width, and the divergence of the beam about to enter the air space of the circumscribed spatial passageway in the open-ended controller assembly. This relationship is the responsibility of the ion source/analyzer magnet/system designer, but given the nature of this established relationship, it is clear that a beam which is too narrow is probably convergent—and a beam which is too wide is probably divergent. Moreover, a beam which is offset to one side is probably deflected through an angle different from the design goal. Accordingly, the adjustments made are solely for the normal operation of the system; the adjustments are not a technique for correcting design errors.

Sequence B: The Adjustments for Correcting Collimation

Step 4: $I_0$ is now adjusted until the beam width is correct. This will cause changes to the beam centering, which may require correction in step 5.

Step 5: A current correction $\Delta I_1$ in the wire coil(s) closest to the magnetic short circuit (or optionally wound around the magnetic short circuit) is now adjusted to correct the centering of the ion beam. A repeat of step 2 and step 5 may be required.

Sequence C: The Adjustments for Correcting Current Uniformity

Step 6: The beam is now re-profiled; and the data is expressed in a table of beam current values, each tabulated value corresponding to a slice of beam aligned with a coil (or coil pair) in the multipole coil array(s). To achieve uniformity, one adjusts each tabulated current towards the mean value. Accordingly one can write a table of errors (the percentage by which each tabulated current should be adjusted).

Step 7: One can calculate the set of currents $\Delta I_k$ to be added algebraically to the existing currents $I_0$ in the multipole coils—by multiplying each error by a pre-determined scaling factor AND by the magnetic rigidity of the ion beam. (Equation VII defines this relationship, but in practice a calibration will likely be performed only once). As noted above, having calculated all the corrections, one can add a small constant to all, to enforce compliance with equation IX, and this minimizes the overall change to the collimation.

Step 8: The currents to the multiple coils are now modified by adding the currents $\Delta I_k$, and the beam is re-profiled. Typically the non-uniformity improves by a large factor as a consequence, but a second or even third individual correction will still produce some additional improvement in current uniformity.

The Overall Result (i) At this stage, one has an ion beam whose overall travel direction is correct, whose overall collimation is correct, and whose current uniformity is accurate and correct. Note that the collimation parameter is not entirely perfect because the later made uniformity corrections have disturbed the parallelism. In fact, one can directly calculate the error in collimation from the table of values of $\Delta I_k$.

(ii) If desired, another multipole controller assembly can optionally now be used in tandem to improve the collimation of the beam. Under these circumstances, this additional assembly would now be used downstream to adjust and to offset the collimation errors just introduced by Steps 6-8 respectively above. However, the use of this additional controller assembly now to improve collimation will concomitantly affect and alter the current uniformity tuning performed in the last sequence of steps; and thus, one will likely need to repeat the specific steps for adjusting the current uniformity (Steps 7 and 8 above) again. The overall success of this optional set of steps will be greater the further the additional controller assembly is distanced from the first controller assembly, given the practical limits imposed by the system design. It is also possible to site this additional assembly upstream of the first.

VIII. Some Distinctive Attributes of the Present Invention

Based on the foregoing, the electromagnetic controller assembly will typically provide and display the following attributes and characteristics:

1. The spatial region of controlled magnetic field shall be bounded by:
   The number of coils wound in series as an array around each of the two long-length bar members;
   The length dimension of the third bar member and magnetic short-circuit which is joined to the two long-length bar members; and
   The location for the last of the nth coil windings disposed farthest on the long bar members from the magnetic short-circuiting third bar member.

2. The actual spatial zone occupied by the passing ion beam is always less than and a subsection of the total volume of magnetic field created within the bounded gap region, this spatial zone being no greater than the region extending between the plane of contact of the first and second coil pairs, and the plane of contact of the n-1th and the nth coil pairs.

3. The magnetic field, existing within the total volume of bounded gap region and the smaller spatial zone through which the ion beam actually passes, has some specific characteristics which are clearly different and distinct from all prior art devices. These include:
   The magnetic scalar potential is deterministically controlled, and is single-valued throughout the region of interest and out to infinity;
   The magnetic field gradient is directly controlled;
   The magnetic field itself is indirectly controlled; it is uniquely determined and adjusted by summing or integrating the currents between the spatial zone of interest and the magnetic short-circuit arm; and
   The magnetic field is always at zero value immediately adjacent to the magnetic short-circuit arm, and is at a non-zero value at all spatial positions occupied by the passing ion beam.

4. The beam collimation is determined by the constant current component passed through all coils, according to Equation IX given above.

5. The current density uniformity can be adjusted using Equation VIII in combination with Equation IX (as given above) to preserve optimal collimation. Note that Equation IX is only applied over the region occupied by the beam. This means that the current in the first coil pair is an independent adjustment which affects the net beam deflection in Equation XV, but does not affect the beam collimation.

This independence of adjustment remains true even if the first coil pair is made much larger, or is longer, or contains more wire turns than the other coil windings. It follows that adjustment of current in coil n1 allows the centroid deflection of the collimated and uniformity controlled beam to be adjusted, and allows any error in overall direction (within practical limits) to be removed.

6. It is preferable but not mandatory that the magnetic short circuit is close against the start of coil n1, for then there is no distortion of the magnetic field gradient, which can be constant. If the coil is not close against the magnetic short, then there will be a region of reduced magnetic field gradient. This may be unimportant in certain embodiments and systems.

7. It is possible to add an additional winding around the magnetic short circuit, and use this to supplement the range of adjustment of the centroid deflection. Furthermore, it would be also possible to subdivide the windings and separate the wire coil conductors by which the current uniformity and collimation functions are performed, though this is a far more complex format than the preferred arrangements described herein.

8. It is possible to add additional windings and/or use further independent power supplies to add components of magnetic field beyond those explicitly enumerated here.

IX. Other Useful Information about the Invention

Additional Details and Characteristics of the Assembly

1. In an apparatus intended for the implantation of ion species (including arsenic and lighter species) into silicon wafers (typically at energies up to 60 keV), the ion beam would be slightly greater than 300 mm in its x-axis dimension (since the largest standard diameter for commercial silicon wafers in use today is 300 mm), and would probably be about 30 mm in its y-axis dimension. The wafer must be fully traversed through the beam in the y-dimension. Too small a y-axis dimension would raise the current and power density in the beam to undesirable levels; while too great a y-axis dimension would increase the required distance through which the wafer must travel in order to clear the peripheral edges of the beam, and would reduce the productivity of the system. For these reasons, the optimum beam y-dimension is estimated to be between 10% and 20% of the x-dimension.

2. It should be clearly understood that the magnetic field gradient cannot be controlled over distances smaller than the x-dimension pitch of the wire coils. It should also be recognized that the y-dimension of the beam is of similar magnitude to the minimum gap distance for the assembly over which the field gradient can be reliably controlled. In a particular instance, modeling using a freely available code such as POISSON (Los Alamos, Poisson Superfish Version 7 available on the LAACG FTP servers) can be used to provide greater precision to these statements.

3. The pitch of the wire coils is preferably between 40% and 80% of the beam maximum y-dimension. Similarly, the winding thickness of the wire coil typically should be significantly less than the pitch. However, some alternative embodiments will utilize substantially larger coiled windings for particular applications and implanting systems.

4. The ion beam uniformity can be measured by means of a traveling Faraday cup or by an array of discrete Faraday cups. For simplicity of discussion, however, an array of Faraday cups equal to the number of coils in one multipole coil array, and aligned in the x-axis direction with the coils, can be placed in the target plane, or close behind it. The aperture of each cup is accurately the same, so that equal measurements in the cups represent a uniform ion beam. It is important that the acceptance of the measuring device in the y-direction receives the entire beam.

Accuracy is compromised if the defining apertures of the measuring device are not in the target plane. Once can choose between placing the profiler hardware directly in the target plane, in which case interlocked mechanisms are required to prevent a collision between the workpiece and the profiler hardware, or placing it just behind the target plane and accepting a slight degradation in uniformity. The error is proportional to the strongest quadrupole field component generated by the multipole adjuster.

Figure 4:
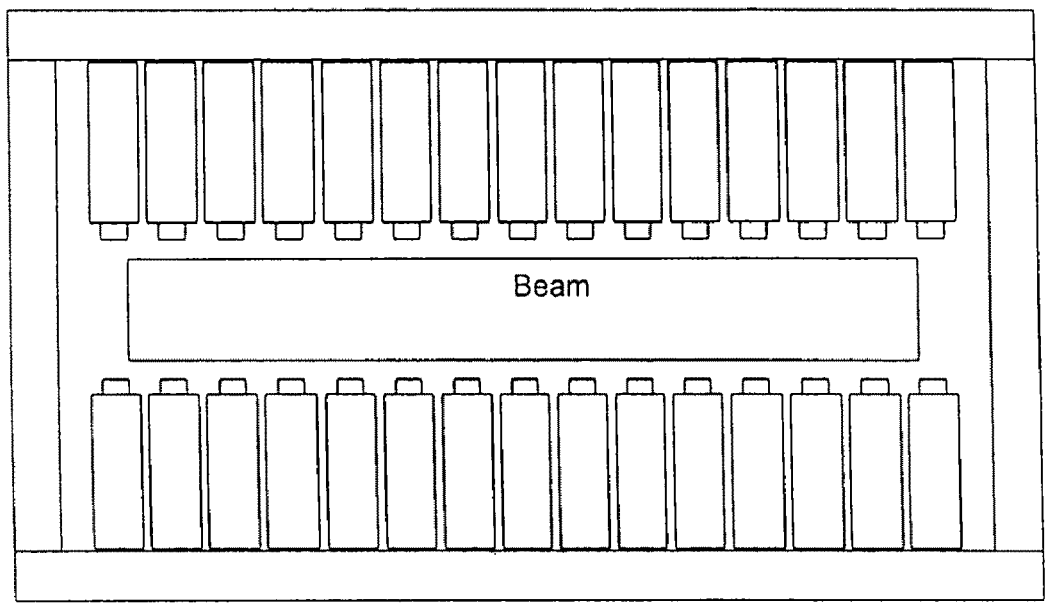
FIG. 4 illustrates a cross-sectional view of a 'Cartesian' multipole conventionally used for controlling beam uniformity.
Figure 5:
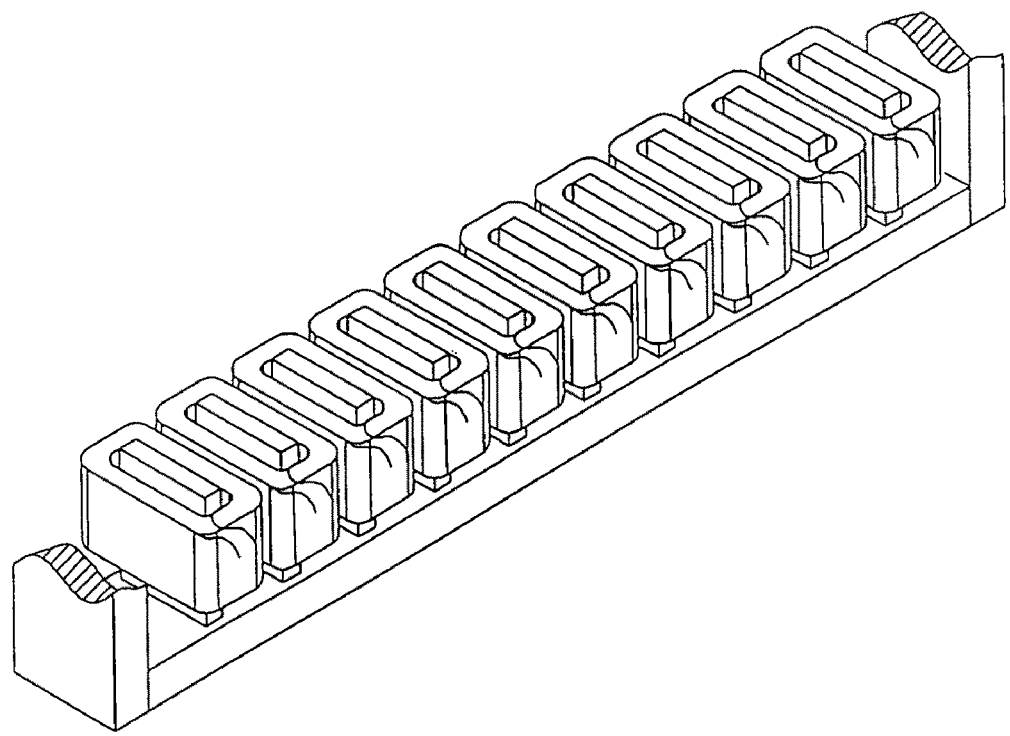
FIG. 5 illustrates a detailed sectional view of the 'Cartesian' multipole of FIG. 4.
Figure 6:
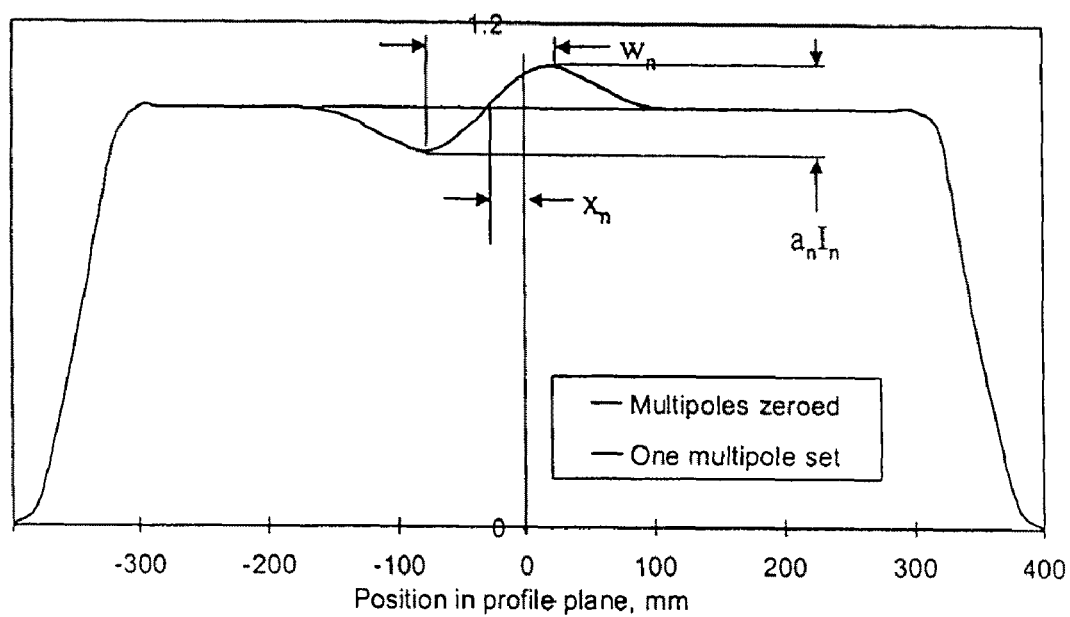
FIG. 6 is a graph showing the effect of exciting a single pair of coils in the 'Cartesian' multipole of FIGS. 4 and 5 on an otherwise uniform ion beam.

Important Differences from Prior Art Devices (i) The present invention allows the multipole field gradients which directly control beam uniformity to be directly controlled. It avoids the difficulty of the prior art device of FIGS. 4 and 5, and which is illustrated via Prior Art FIG. 6, whereby excitation of a single coil or coil pair in a multipole device produces a change in field which generates both an increase and a decrease in beam current density, in adjacent zones.

Figure 7:
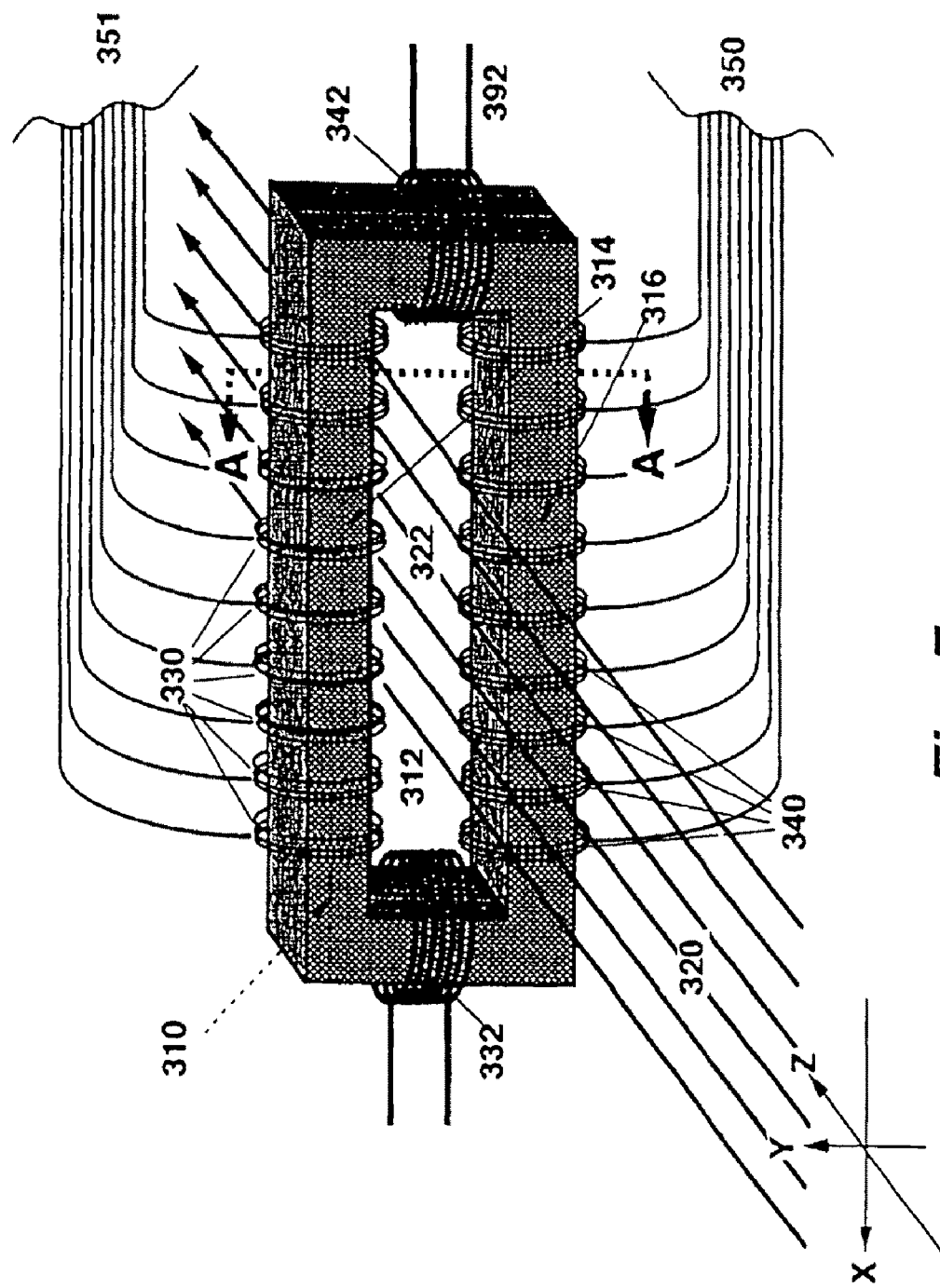
FIG. 7 illustrates the arrangement of a device for superimposing quadrupole and multipole fields as described by U.S. Pat. No. 6,933,507.

(ii) The present device is designed to superimpose a strong quadrupole field and a dipole field on the adjustable multipole field. It does this with approximately half the mass of the device shown in Prior Art FIG. 7, and without the limitation that the ampere turns in all the windings must sum to zero. In the present invention the sum of all the currents is never zero, and there is freedom to adjust them as required by circumstances. The present device adds an overall deflection to the beam which is not present in the Prior Art device.

(iii) The devices shown by Prior Art FIGS. 2 through 7 are all designed so that the average magnetic field is close to zero; and, in general, the magnetic field at or near the center of each prior art device will be zero. In direct contrast, the magnetic field in the present invention is never zero in the region occupied by the beam, and this difference is achieved by the unique assembly design.

In addition, this new design has two important effects: it deflects the ion beam as a whole, through an angle which can be adjusted as described above; and it avoids creating a region of markedly different space-charge neutralization around a local zero in the magnetic field within the beam. It is now well established that such a zero causes a non-uniform feature in the current-density profile of the beam which is highly undesirable.

(iv) The present device combines a dipole field, a quadrupole field, and multipole field comprising a linear array of regions of individually controllable magnetic field gradient, in a combination which is optimized for use in the simultaneous control of uniformity, deflection, and collimation of an ion beam.

The present invention is not to be limited in scope nor restricted in form except by the claims appended hereto:

What I claim is:

1. In an ion implanter apparatus including a source for the generation of charged particles as a traveling ion beam, means for directing the traveling ion beam in a desired direction, and a plane surface for the implantation of charged particles in the traveling ion beam into a prepared workpiece, the improvement of
   an electromagnetic corrector assembly for deflecting charged particles in a traveling ion beam into a desired trajectory, or for collimating charged particles in a traveling ion beam, or for adjusting and controlling the current uniformity of charged particles in a traveling ion beam, said electromagnetic corrector assembly comprising:
   an open-ended framework having a measurable interior spatial volume and comprised of at least
   (i) a first rod-like arm of fixed axial length and girth having two discrete ends and formed of a ferromagnetic material,
   (ii) a second rod-like arm of prechosen axial length and girth having two discrete ends and formed of a ferromagnetic material, said second rod-like arm being at a preset gap distance from said first rod-like arm, and
   (iii) a third rod-like arm of predetermined axial length and girth having two discrete ends and formed of a ferromagnetic material, said third rod-like arm being tangibly attached to and joined with said first and second rod-like arms to create a unified ferromagnetic framework with demonstrably high magnetic permeability;
   at least a first multipole coil array disposed upon said first rod-like arm, said multipole coil array having a discernible length and being comprised of at least three wire coils wound independently upon and positioned adjacently at preselected sites over the axial length of said first rod-like arm, each of said wire coils of said multipole coil array being formed of electrically conductive matter and being wound to lie orthogonally to the axial length of said first rod-like arm;
   a circumscribed spatial passageway present within the interior spatial volume of said open-ended framework wherein said spatial passageway is dimensionally circumscribed in an x-axis direction by the length of said multipole coil array and in a y-axis direction by the distance separating said multipole coil array from the plane surface of said second rod-like arm, said circumscribed spatial passageway being suitable for the application of a contiguous magnetic field upon an ion beam traveling therethrough; and
   on-demand means for passing electrical current independently and concurrently through each of said adjacently positioned wire coils of said multipole coil array, whereby
   (1) each energized wire coil independently and concurrently generates an orthogonally extending and individually adjustable zone of magnetic field gradient across said circumscribed spatial passageway,
   (2) each zone of magnetic field gradient forming said contiguous magnetic field is individually and concurrently altered on-demand to generate a customized magnetic field gradient across said circumscribed spatial passageway,
   (3) said plurality of customized magnetic field gradient zones collectively form a contiguous magnetic field over said circumscribed spatial passageway,
   (4) the application of said customized magnetic field gradients of said contiguous magnetic field upon an ion beam traveling through said circumscribed spatial passageway can be used to increase the uniformity of charged particles in a traveling ion beam, or to improve the parallelism of charged particles in a traveling ion beam, or to alter the overall direction of charged particles in a traveling ion beam, and
   (5) said third rod-like arm of said open-ended framework serves as a short-circuit member and creates a magnetic short-circuit between said first rod-like arm and said second rod-like arm.

2. The electromagnetic controller assembly recited in claim 1 further comprising a second multipole coil array disposed upon said second rod-like arm, said second multipole coil array having a discernible length and being comprised of at least three wire coils wound independently upon and positioned adjacently at preselected sites over the axial length of said second rod-like arm, each of said wire coils of said second multipole coil array being formed of electrically conductive matter and being wound to lie orthogonally to the axial length of said second rod-like arm.

3. The electromagnetic controller of claim 2, wherein said wire coils of said second multipole coil array are in correspondence with said wire coils of said first multipole coil array.

4. The electromagnetic controller assembly as recited in claim 1 wherein said open-ended framework having a prescribed interior spatial volume is selected from the group consisting of open-ended polygonal figures having at least three sides, open-ended oval and circular forms, and U-shaped objects.

5. The electromagnetic controller assembly as recited in claim 1 wherein the traveling ion beam is selected from the group consisting of continuous ions beams and scanned ion beams.

6. In an ion implanter apparatus including a source for the generation of charged particles as a traveling ion beam, means for directing the traveling ion beam in a desired direction, and a plane surface for the implantation of charged particles in the traveling ion beam into a prepared workpiece, the improvement of an electromagnetic corrector assembly for deflecting charged particles in a traveling ion beam, for collimating charged particles in a traveling ion beam, and for adjusting and controlling the current uniformity of charged particles in a traveling ion beam, said electromagnetic corrector assembly comprising:

a substantially U-shaped frame having a measurable interior spatial volume and comprised of at least
(i) a first elongated rod of fixed axial length and girth which has two discrete rod ends and is formed of a ferromagnetic material,
(ii) a second elongated rod of fixed axial length and girth which has two discrete rod ends and is formed of a ferromagnetic material, said second elongated rod being at a preset gap distance from and in a substantially parallel position to said first elongated rod, and
(iii) a third discrete rod of fixed axial length and girth, whose length is shorter than that of said first and second rods, which has two discrete rod ends and is formed of a ferromagnetic material, said third rod being positioned substantially perpendicularly to and being tangibly attached to and joined with said first and second rods to create a unified ferromagnetic framework with demonstrably high magnetic permeability;

a first multipole coil array disposed upon said first elongated rod, said first multipole coil array having a discernible length and being comprised of at least three wire coils wound independently upon and positioned adjacently at preselected sites over the axial length of said first elongated rod, each of said wire coils of said first multipole coil array being formed of electrically conductive matter and being wound to lie orthogonally to the axial length of said first rod;

a second multipole coil array disposed upon said second elongated rod, said second multipole coil array having a discernible length and being comprised of at least three wire coils wound independently upon and positioned adjacently at preselected sites over the axial length of said second elongated rod, each of said wire coils of said second array being formed of electrically conductive matter, and being wound to lie orthogonally to the axial length of said second rod;

a circumscribed spatial passageway present within the interior spatial volume of said U-shaped frame wherein said spatial passageway is dimensionally circumscribed in an x-axis direction by the length of said first and second multipole coil arrays and in a y-axis direction by the distance separating the plane surface of said first multipole coil array from the plane surface of said second multipole coil array, said circumscribed spatial passageway being suitable for the application of a contiguous magnetic field upon an ion beam traveling therethrough; and on-demand means for passing electrical current independently and concurrently through each of said adjacently positioned wire coils of said first and second multipole coil arrays, whereby
(1) each energized wire coil independently and concurrently generates an orthogonally extending and individually adjustable zone of magnetic field gradient across said circumscribed spatial passageway,
(2) each zone of magnetic field gradient forming said contiguous magnetic field can be individually and concurrently altered on-demand to generate a customized magnetic field gradient over said circumscribed spatial passageway,
(3) said plurality of customized magnetic field gradient zones collectively form a contiguous magnetic field over said circumscribed spatial passageway,
(4) the application of said customized magnetic field gradients of said contiguous magnetic field upon an ion beam traveling through said circumscribed spatial passageway can used to increase the uniformity of charged particles in a traveling ion beam, or to improve the parallelism of charged particles in a traveling ion beam, or to alter the trajectories of charged particles in a traveling ion beam, and
(5) said third rod of said U-shaped frame serves as a magnetic short-circuit member and creates an electromagnetic short-circuit between said energized multipole coil arrays disposed upon said first rod and said second rod.

7. The U-shaped electromagnetic corrector assembly as recited in claim 6, wherein said wire coils of said second multipole coil array are in correspondence with said wire coils of said first multipole coil array.

8. The U-shaped electromagnetic corrector assembly as recited in claim 6 wherein said spatial passageway is dimensionally circumscribed in an x-axis direction at one end by a plane which lies adjacent to said magnetic short circuit, is dimensionally circumscribed in an x-axis direction at another end by a plane which lies adjacent to the ends of said first and second multipole coil arrays of wire coils, and is dimensionally circumscribed in a y-axis direction by said preset gap distance separating said wire coils of said first multipole coil array from said coils of said second multipole coil array.

9. The U-shaped electromagnetic corrector assembly as recited in claim 6 wherein said traveling ion beam is selected from the group consisting of continuous ion beams and scanned ion beams.

10. An electromagnetic corrector assembly for deflecting charged particles in a traveling ion beam, for collimating charged particles in a traveling ion beam, and for adjusting and controlling the current uniformity of charged particles in a traveling ion beam, said electromagnetic corrector assembly comprising:

a substantially U-shaped frame having a measurable interior spatial volume and comprised of at least
(i) a first elongated rod of fixed axial length and girth which has two discrete rod ends and is formed of a ferromagnetic material,
(ii) a second elongated rod of fixed axial length and girth which has two discrete rod ends and is formed of a ferromagnetic material, said second elongated rod being at a preset gap distance from and in a substantially parallel position to said first elongated rod, and
(iii) a third discrete rod of fixed axial length and girth which has two discrete rod ends and is formed of a ferromagnetic material, said third rod being shorter than said first and second rods and being positioned substantially perpendicularly to and being tangibly attached to and joined with said first and second rods to create a unified ferromagnetic framework with demonstrably high magnetic permeability;

a first multipole coil array disposed upon said first elongated rod, said first multipole coil array having a discernible length and being comprised of at least three wire coils wound independently upon and positioned adjacently at preselected sites over the axial length of said first elongated rod, each of said wire coils of said first multipole coil array being formed of electrically conductive matter and being wound to lie orthogonally to the axial length of said first rod;

a second multipole coil array disposed upon said second elongated rod, said second multipole coil array having a discernible length and being comprised of at least three wire coils wound independently upon and positioned adjacently at preselected sites over the axial length of said second elongated rod, each of said wire coils of said second array being formed of electrically conductive matter, and being wound to lie orthogonally to the axial length of said second rod;

a circumscribed spatial passageway present within the interior spatial volume of said U-shaped frame wherein said spatial passageway is dimensionally circumscribed in an x-axis direction by the length of said first and second multipole coil arrays and in a y-axis direction by the distance separating the plane surface of said first multipole coil array from the plane surface of said second multipole coil array, said circumscribed spatial passageway being suitable for the application of a contiguous magnetic field upon an ion beam traveling therethrough; and on-demand means for passing electrical current independently and concurrently through each of said adjacently positioned wire coils of said first and second multipole coil arrays, whereby (1) each energized wire coil independently and concurrently generates an orthogonally extending and individually adjustable zone of magnetic field gradient across said circumscribed spatial passageway, (2) each zone of magnetic field gradient forming said contiguous magnetic field can be individually and concurrently altered on-demand to generate a customized magnetic field gradient over said circumscribed spatial passageway, (3) said plurality of customized magnetic field gradient zones collectively form a contiguous magnetic field over said circumscribed spatial passageway, (4) the application of said customized magnetic field gradients of said contiguous magnetic field upon an ion beam traveling through said circumscribed spatial passageway can used to increase the uniformity of charged particles in a traveling ion beam, or to improve the parallelism of charged particles in a traveling ion beam, or to alter the trajectories of charged particles in a traveling ion beam, and (5) said third rod of said U-shaped frame serves as a magnetic short-circuit member and creates a magnetic short-circuit between said energized multipole coil arrays disposed upon said first rod and said second rod, minimizing the magnetic field immediately adjacent to said third rod.

11. The U-shaped electromagnetic corrector assembly as recited in claim 10 wherein said wire coils of said second multipole coil array are in correspondence with said wire coils of said first multipole coil array.

12. In an ion implanter apparatus including a source for the generation of charged particles as a traveling ion beam, means for directing the traveling ion beam in a desired direction, and a plane surface for the implantation of charged particles in the traveling ion beam into a prepared workpiece, the improvement of the electromagnetic corrector assembly of claim 10 or claim 11.

* * * * *